United States Patent
Tracey

(10) Patent No.: US 9,559,656 B2
(45) Date of Patent: Jan. 31, 2017

(54) SYSTEM FOR ADJUSTING LOUDNESS OF AUDIO SIGNALS IN REAL TIME

(75) Inventor: James Tracey, Laguna Niguel, CA (US)

(73) Assignee: DTS LLC, Calabasas, CA (US)

( * ) Notice: Subject to any disclaimer, the term of this patent is extended or adjusted under 35 U.S.C. 154(b) by 520 days.

(21) Appl. No.: 13/452,494

(22) Filed: Apr. 20, 2012

(65) Prior Publication Data

US 2013/0272543 A1  Oct. 17, 2013

Related U.S. Application Data

(63) Continuation of application No. 13/445,769, filed on Apr. 12, 2012.

(51) Int. Cl.
| | |
|---|---|
| *H03G 3/32* | (2006.01) |
| *H03G 5/16* | (2006.01) |
| *H03G 5/00* | (2006.01) |
| *H04R 3/00* | (2006.01) |
| *H04R 5/04* | (2006.01) |
| *H04S 7/00* | (2006.01) |

(52) U.S. Cl.
CPC ............... *H03G 3/32* (2013.01); *H03G 5/005* (2013.01); *H03G 5/165* (2013.01); *H04R 3/00* (2013.01); *H04R 5/04* (2013.01); *H04R 2430/01* (2013.01); *H04S 7/00* (2013.01); *H04S 2400/13* (2013.01)

(58) Field of Classification Search
USPC .................................. 381/107, 57; 704/200
See application file for complete search history.

(56) References Cited

U.S. PATENT DOCUMENTS

| | | |
|---|---|---|
| 3,101,446 A | 8/1963 | Glomb et al. |
| 3,127,477 A | 3/1964 | David, Jr. et al. |

(Continued)

FOREIGN PATENT DOCUMENTS

| | | |
|---|---|---|
| AU | 2005299410 | 5/2006 |
| AU | 2007243586 | 11/2007 |

(Continued)

OTHER PUBLICATIONS

Broadcasting Service, ITU-R, Mar. 2011, pp. 4, 5. http://www.itu.int/dms_pubrec/itu-r/rec/bs/R-REC-BS.1770-2-201103-S!!PDF-E.pdf.*

(Continued)

*Primary Examiner* — Duc Nguyen
*Assistant Examiner* — Yogeshkumar Patel
(74) *Attorney, Agent, or Firm* — Knobbe, Martens, Olson & Bear, LLP

(57) ABSTRACT

A method of adjusting a loudness of an audio signal in real time may include receiving an electronic audio signal and dividing the audio signal into a plurality of frames. Processing of the frames may be performed in real time. The processing may include measuring initial loudness values for blocks of samples in a frame to produce a plurality of initial loudness values, and computing a weighted average of at least some of the initial loudness values. The weights may be selected based on one or more of the recency of the initial loudness values, variation of the initial loudness values, and estimated information content of the audio signal. The processing may further include selectively discarding at least some of the loudness values that reach an adaptive loudness threshold. Weights can be adjusted based on the variation of the loudness values of the audio signal.

19 Claims, 14 Drawing Sheets

(56) References Cited

U.S. PATENT DOCUMENTS

| | | | |
|---|---|---|---|
| 3,665,345 A | 5/1972 | Dolby | |
| 3,828,280 A | 8/1974 | Dolby | |
| 3,845,416 A | 10/1974 | Dolby | |
| 3,846,719 A | 11/1974 | Dolby | |
| 3,903,485 A | 9/1975 | Dolby | |
| 3,967,219 A | 6/1976 | Dolby | |
| 4,074,083 A | 2/1978 | Berkovitz et al. | |
| 4,355,383 A | 10/1982 | Dolby | |
| 4,490,691 A | 12/1984 | Dolby | |
| 4,700,361 A | 10/1987 | Todd et al. | |
| 4,739,514 A | 4/1988 | Short et al. | |
| 4,882,758 A | 11/1989 | Uekawa et al. | |
| 4,887,299 A | 12/1989 | Cummins et al. | |
| 5,027,410 A | 6/1991 | Williamson et al. | |
| 5,172,358 A | 12/1992 | Kimura | |
| 5,175,769 A | 12/1992 | Hejna, Jr. et al. | |
| 5,237,559 A | 8/1993 | Murphy et al. | |
| 5,278,912 A | 1/1994 | Waldhauer | |
| 5,363,147 A | 11/1994 | Joseph et al. | |
| 5,402,500 A | 3/1995 | Sims, Jr. | |
| 5,471,527 A | 11/1995 | Ho et al. | |
| 5,500,902 A | 3/1996 | Stockham, Jr. et al. | |
| 5,530,760 A | 6/1996 | Paisley | |
| 5,537,479 A | 7/1996 | Kreisel et al. | |
| 5,544,140 A | 8/1996 | Seagrave et al. | |
| 5,579,404 A | 11/1996 | Fielder et al. | |
| 5,583,962 A | 12/1996 | Davis et al. | |
| 5,615,270 A * | 3/1997 | Miller | H03G 3/32 381/108 |
| 5,623,577 A | 4/1997 | Fielder | |
| 5,631,714 A | 5/1997 | Saadoun | |
| 5,632,003 A | 5/1997 | Davidson et al. | |
| 5,632,005 A | 5/1997 | Davis et al. | |
| 5,633,981 A | 5/1997 | Davis | |
| 5,659,466 A | 8/1997 | Norris et al. | |
| 5,663,727 A | 9/1997 | Vokac | |
| 5,677,987 A | 10/1997 | Seki et al. | |
| 5,710,752 A | 1/1998 | Seagrave et al. | |
| 5,727,119 A | 3/1998 | Davidson et al. | |
| 5,742,689 A | 4/1998 | Tucker et al. | |
| 5,757,465 A | 5/1998 | Seagrave et al. | |
| 5,812,969 A | 9/1998 | Barber et al. | |
| 5,848,171 A | 12/1998 | Stockham, Jr. et al. | |
| 5,862,228 A | 1/1999 | Davis | |
| 5,873,065 A | 2/1999 | Akagiri et al. | |
| 5,896,358 A | 4/1999 | Endoh et al. | |
| 5,909,664 A | 6/1999 | Davis et al. | |
| 5,930,373 A | 7/1999 | Shashoua et al. | |
| 5,966,689 A | 10/1999 | McCree | |
| 6,002,776 A | 12/1999 | Bhadkamkar et al. | |
| 6,016,295 A | 1/2000 | Endoh et al. | |
| 6,021,386 A | 2/2000 | Davis et al. | |
| 6,041,295 A * | 3/2000 | Hinderks | H04B 1/665 704/206 |
| 6,064,962 A | 5/2000 | Oshikiri et al. | |
| 6,084,974 A | 7/2000 | Niimi | |
| 6,088,461 A | 7/2000 | Lin et al. | |
| 6,108,431 A | 8/2000 | Bachler | |
| 6,148,085 A | 11/2000 | Jung | |
| 6,185,309 B1 | 2/2001 | Attias | |
| 6,211,940 B1 | 4/2001 | Seagrave et al. | |
| 6,240,388 B1 | 5/2001 | Fukuchi | |
| 6,263,371 B1 | 7/2001 | Geagan, III et al. | |
| 6,301,555 B2 * | 10/2001 | Hinderks | G10L 21/0264 704/200.1 |
| 6,311,155 B1 | 10/2001 | Vaudrey et al. | |
| 6,327,366 B1 | 12/2001 | Uvacek et al. | |
| 6,332,119 B1 | 12/2001 | Hinderks | |
| 6,351,733 B1 * | 2/2002 | Saunders | H04S 3/00 434/308 |
| 6,370,255 B1 * | 4/2002 | Schaub | H04R 25/505 381/104 |
| 6,430,533 B1 | 8/2002 | Kolluru et al. | |
| 6,442,278 B1 | 8/2002 | Vaudrey et al. | |
| 6,442,281 B2 | 8/2002 | Sato et al. | |
| 6,446,037 B1 | 9/2002 | Fielder et al. | |
| 6,473,731 B2 | 10/2002 | Hinderks | |
| 6,498,822 B1 | 12/2002 | Tanaka | |
| 6,529,605 B1 | 3/2003 | Christoph | |
| 6,606,388 B1 | 8/2003 | Townsend et al. | |
| 6,624,873 B1 | 9/2003 | Callahan, Jr. et al. | |
| 6,639,989 B1 | 10/2003 | Zacharov et al. | |
| 6,650,755 B2 | 11/2003 | Vaudrey et al. | |
| 6,651,041 B1 | 11/2003 | Juric | |
| 6,664,913 B1 * | 12/2003 | Craven | H03M 7/3046 341/138 |
| 6,704,711 B2 | 3/2004 | Gustafsson et al. | |
| 6,760,448 B1 | 7/2004 | Gundry | |
| 6,766,176 B1 | 7/2004 | Gupta et al. | |
| 6,768,801 B1 | 7/2004 | Wagner et al. | |
| 6,784,812 B2 | 8/2004 | Craven et al. | |
| 6,891,482 B2 | 5/2005 | Craven et al. | |
| 6,920,223 B1 | 7/2005 | Fosgate | |
| 6,970,567 B1 | 11/2005 | Gundry et al. | |
| 6,980,933 B2 | 12/2005 | Cheng et al. | |
| 6,993,480 B1 | 1/2006 | Klayman | |
| 7,058,188 B1 | 6/2006 | Allred | |
| 7,072,477 B1 | 7/2006 | Kincaid | |
| 7,072,831 B1 | 7/2006 | Etter | |
| 7,116,789 B2 | 10/2006 | Layton et al. | |
| 7,152,032 B2 | 12/2006 | Suzuki et al. | |
| 7,251,337 B2 | 7/2007 | Jacobs | |
| 7,280,664 B2 | 10/2007 | Fosgate et al. | |
| 7,283,954 B2 | 10/2007 | Crockett et al. | |
| 7,349,841 B2 | 3/2008 | Furuta et al. | |
| 7,395,211 B2 | 7/2008 | Watson et al. | |
| 7,418,394 B2 * | 8/2008 | Cowdery | G10L 19/022 704/203 |
| 7,424,423 B2 | 9/2008 | Bazzi et al. | |
| 7,448,061 B2 | 11/2008 | Richards et al. | |
| 7,454,331 B2 | 11/2008 | Vinton et al. | |
| 7,461,002 B2 | 12/2008 | Crockett et al. | |
| 7,508,947 B2 | 3/2009 | Smithers | |
| 7,533,346 B2 | 5/2009 | Mcgrath et al. | |
| 7,536,021 B2 | 5/2009 | Dickins et al. | |
| 7,539,319 B2 | 5/2009 | Dickins et al. | |
| 7,551,745 B2 | 6/2009 | Gundry et al. | |
| 7,583,331 B2 | 9/2009 | Whitehead | |
| 7,610,205 B2 | 10/2009 | Crockett | |
| 7,617,109 B2 | 11/2009 | Smithers et al. | |
| 7,711,123 B2 | 5/2010 | Crockett | |
| 7,751,572 B2 | 7/2010 | Villemoes et al. | |
| 7,756,274 B2 | 7/2010 | Layton et al. | |
| 7,784,938 B2 | 8/2010 | Richards | |
| 7,848,531 B1 | 12/2010 | Vickers et al. | |
| 7,925,038 B2 | 4/2011 | Taenzer et al. | |
| 7,965,848 B2 | 6/2011 | Villemoes et al. | |
| 7,973,878 B2 | 7/2011 | Whitehead | |
| 8,019,095 B2 | 9/2011 | Seefeldt | |
| 8,032,385 B2 | 10/2011 | Smithers et al. | |
| RE42,935 E | 11/2011 | Cheng et al. | |
| 8,085,941 B2 | 12/2011 | Taenzer | |
| RE43,132 E | 1/2012 | Jacobs | |
| 8,090,120 B2 | 1/2012 | Seefeldt | |
| 8,144,881 B2 | 3/2012 | Crockett et al. | |
| 8,204,742 B2 | 6/2012 | Yang et al. | |
| 8,306,241 B2 | 11/2012 | Kim et al. | |
| 8,315,398 B2 * | 11/2012 | Katsianos | H03G 9/005 381/101 |
| 8,315,411 B2 * | 11/2012 | Hanna | H03G 3/3005 381/106 |
| 8,538,042 B2 * | 9/2013 | Yang | H04R 3/04 381/103 |
| 8,594,345 B2 * | 11/2013 | Hess | H03G 3/32 381/102 |
| 9,312,829 B2 | 4/2016 | Tracey | |
| 2001/0027393 A1 | 10/2001 | Touimi et al. | |
| 2002/0013698 A1 | 1/2002 | Vaudrey et al. | |
| 2002/0040295 A1 * | 4/2002 | Saunders | H04S 3/00 704/200 |
| 2002/0076072 A1 | 6/2002 | Cornelisse | |
| 2002/0097882 A1 | 7/2002 | Greenberg et al. | |
| 2002/0146137 A1 | 10/2002 | Kuhnel et al. | |

(56) References Cited

U.S. PATENT DOCUMENTS

| | | |
|---|---|---|
| 2002/0147595 A1 | 10/2002 | Baumgarte |
| 2003/0002683 A1 | 1/2003 | Vaudrey et al. |
| 2003/0035549 A1 | 2/2003 | Bizjak |
| 2004/0024591 A1 | 2/2004 | Boillot et al. |
| 2004/0042617 A1 | 3/2004 | Beerends et al. |
| 2004/0042622 A1 | 3/2004 | Saito |
| 2004/0044525 A1 | 3/2004 | Vinton et al. |
| 2004/0057586 A1 | 3/2004 | Licht |
| 2004/0071284 A1 | 4/2004 | Abutalebi et al. |
| 2004/0076302 A1 | 4/2004 | Christoph |
| 2004/0078200 A1 | 4/2004 | Alves |
| 2004/0122662 A1 | 6/2004 | Crockett |
| 2004/0148159 A1 | 7/2004 | Crockett et al. |
| 2004/0165730 A1 | 8/2004 | Crockett et al. |
| 2004/0165736 A1 | 8/2004 | Hetherington et al. |
| 2004/0172240 A1 | 9/2004 | Crockett et al. |
| 2004/0184537 A1 | 9/2004 | Geiger et al. |
| 2004/0190740 A1 | 9/2004 | Chalupper et al. |
| 2005/0065781 A1 | 3/2005 | Tell et al. |
| 2005/0069162 A1 | 3/2005 | Haykin et al. |
| 2005/0075864 A1 | 4/2005 | Kim |
| 2005/0152447 A1* | 7/2005 | Jouppi ............... G06K 9/00255 375/240.01 |
| 2005/0246170 A1 | 11/2005 | Vignoli et al. |
| 2006/0002572 A1 | 1/2006 | Smithers et al. |
| 2006/0129256 A1 | 6/2006 | Melanson et al. |
| 2006/0130637 A1 | 6/2006 | Crebouw |
| 2007/0025480 A1* | 2/2007 | Tackin .................. G10L 25/90 375/345 |
| 2007/0027943 A1 | 2/2007 | Jensen et al. |
| 2007/0056064 P1 | 3/2007 | Roose et al. |
| 2007/0092089 A1 | 4/2007 | Seefeldt et al. |
| 2007/0118363 A1 | 5/2007 | Sasaki et al. |
| 2007/0134635 A1 | 6/2007 | Hardy et al. |
| 2007/0268461 A1 | 11/2007 | Whitehead |
| 2007/0291959 A1* | 12/2007 | Seefeldt .................. H03G 3/32 381/104 |
| 2008/0022009 A1 | 1/2008 | Yuen et al. |
| 2008/0095385 A1 | 4/2008 | Tourwe |
| 2008/0170721 A1 | 7/2008 | Sun et al. |
| 2008/0228473 A1 | 9/2008 | Kinoshita |
| 2008/0232612 A1 | 9/2008 | Tourwe |
| 2008/0249772 A1 | 10/2008 | Martynovich et al. |
| 2008/0284677 A1 | 11/2008 | Whitehead et al. |
| 2009/0063159 A1 | 3/2009 | Crockett |
| 2009/0067644 A1* | 3/2009 | Crockett .................. H04S 7/00 381/98 |
| 2009/0097676 A1* | 4/2009 | Seefeldt .................. H04S 7/00 381/107 |
| 2009/0112579 A1 | 4/2009 | Li et al. |
| 2009/0161883 A1* | 6/2009 | Katsianos ............. H03G 9/005 381/57 |
| 2009/0192795 A1 | 7/2009 | Cech |
| 2009/0220109 A1 | 9/2009 | Crockett et al. |
| 2009/0271185 A1* | 10/2009 | Smithers .............. H03G 11/008 704/225 |
| 2009/0290727 A1* | 11/2009 | Seefeldt ............... H03G 3/3089 381/107 |
| 2009/0304190 A1* | 12/2009 | Seefeldt .................. G10L 25/69 381/56 |
| 2009/0322800 A1 | 12/2009 | Atkins |
| 2010/0042407 A1 | 2/2010 | Crockett |
| 2010/0049346 A1 | 2/2010 | Boustead et al. |
| 2010/0060857 A1 | 3/2010 | Richards et al. |
| 2010/0066976 A1 | 3/2010 | Richards et al. |
| 2010/0067108 A1 | 3/2010 | Richards et al. |
| 2010/0067709 A1 | 3/2010 | Seefeldt |
| 2010/0073769 A1 | 3/2010 | Richards et al. |
| 2010/0076769 A1 | 3/2010 | Yu |
| 2010/0083344 A1 | 4/2010 | Schildbach et al. |
| 2010/0106507 A1 | 4/2010 | Muesch |
| 2010/0121634 A1 | 5/2010 | Muesch |
| 2010/0174540 A1 | 7/2010 | Seefeldt |
| 2010/0177903 A1 | 7/2010 | Vinton et al. |
| 2010/0179808 A1 | 7/2010 | Brown |
| 2010/0185439 A1 | 7/2010 | Crockett |
| 2010/0198377 A1 | 8/2010 | Seefeldt |
| 2010/0198378 A1 | 8/2010 | Smithers et al. |
| 2010/0202632 A1* | 8/2010 | Seefeldt .................. H03G 3/10 381/107 |
| 2010/0250258 A1 | 9/2010 | Smithers et al. |
| 2010/0272290 A1* | 10/2010 | Carroll .................. H03G 7/007 381/107 |
| 2011/0009987 A1 | 1/2011 | Seefeldt |
| 2011/0022402 A1 | 1/2011 | Engdegard et al. |
| 2011/0022589 A1 | 1/2011 | Bauer et al. |
| 2011/0054887 A1 | 3/2011 | Muesch |
| 2011/0125507 A1 | 5/2011 | Yu |
| 2011/0137662 A1 | 6/2011 | Mcgrath et al. |
| 2011/0150242 A1* | 6/2011 | Zong .................. H03G 9/005 381/107 |
| 2011/0153050 A1* | 6/2011 | Bauer .................. G10L 19/018 700/94 |
| 2011/0188704 A1 | 8/2011 | Radhakrishnan et al. |
| 2011/0208528 A1* | 8/2011 | Schildbach ........... G10L 19/173 704/500 |
| 2011/0219097 A1 | 9/2011 | Crockett et al. |
| 2011/0221864 A1 | 9/2011 | Filippini et al. |
| 2011/0222835 A1 | 9/2011 | Dougherty et al. |
| 2011/0227898 A1 | 9/2011 | Whitehead |
| 2011/0243338 A1* | 10/2011 | Brown .................. H04S 3/002 381/17 |
| 2011/0255712 A1 | 10/2011 | Urata |
| 2011/0274281 A1 | 11/2011 | Brown et al. |
| 2011/0311062 A1 | 12/2011 | Seefeldt et al. |
| 2012/0008800 A1 | 1/2012 | Goerke |
| 2012/0039490 A1* | 2/2012 | Smithers .............. H03G 9/025 381/107 |
| 2012/0046772 A1* | 2/2012 | Dickins .................. G10L 25/78 700/94 |
| 2012/0063121 A1 | 3/2012 | Atkins |
| 2012/0250895 A1 | 10/2012 | Katsianos |
| 2012/0328115 A1* | 12/2012 | Wolters .................. H03G 9/00 381/57 |
| 2013/0073283 A1 | 3/2013 | Yamabe |
| 2013/0272542 A1 | 10/2013 | Tracey |

FOREIGN PATENT DOCUMENTS

| | | |
|---|---|---|
| AU | 2007309691 | 5/2008 |
| AU | 2008266847 | 12/2008 |
| BR | PI0518278-6 | 11/2008 |
| BR | PI0709877-4 | 7/2011 |
| BR | PI0711063-4 | 8/2011 |
| CA | 2581810 | 5/2006 |
| CN | 1910816 | 2/2007 |
| CN | 200580036760.7 | 10/2007 |
| CN | 200780011056.5 | 4/2009 |
| CN | 200780011710.2 | 4/2009 |
| CN | 200780014742.8 | 5/2009 |
| CN | 200780038594.3 | 9/2009 |
| CN | 200780049200.4 | 11/2009 |
| CN | 200780040917.2 | 12/2009 |
| CN | 200880008969.6 | 3/2010 |
| CN | 200880024506.9 | 6/2010 |
| CN | 200880024525.1 | 7/2010 |
| DE | 43 35 739 A1 | 5/1994 |
| DE | 10323126 | 12/2004 |
| EP | 0 661 905 B1 | 3/1995 |
| EP | 05818505.9 | 7/2007 |
| EP | 1 850 328 | 10/2007 |
| EP | 1987586 | 5/2008 |
| EP | 2082480 | 5/2008 |
| EP | 2122828 | 7/2008 |
| EP | 2 002 539 A1 | 12/2008 |
| EP | 7753095.4 | 12/2008 |
| EP | 2 011 234 A1 | 1/2009 |
| EP | 7754779.2 | 1/2009 |
| EP | 2 168 237 A2 | 3/2010 |
| EP | 08768564.0 | 3/2010 |
| EP | 8780173.4 | 3/2010 |
| EP | 10184647.5 | 12/2010 |

(56) References Cited

FOREIGN PATENT DOCUMENTS

| | | |
|---|---|---|
| EP | 2 168 122 B1 | 11/2011 |
| EP | 08780174.2 | 11/2011 |
| FR | 282 0573 | 8/2002 |
| GB | 2327835 | 2/1999 |
| HK | 09112054.9 | 12/2009 |
| HK | 10107878.0 | 5/2010 |
| HK | 09106026.6 | 7/2011 |
| JP | 6-334459 | 12/1994 |
| JP | 7-122953 | 5/1995 |
| JP | 2006-524968 | 11/2006 |
| JP | 2007-104407 | 4/2007 |
| JP | 2007-539070 | 5/2008 |
| JP | 2009-504190 | 9/2009 |
| JP | 2009-504219 | 9/2009 |
| JP | 2009-507694 | 10/2009 |
| JP | 2009-533304 | 3/2010 |
| JP | 2009-535268 | 3/2010 |
| JP | 2009-544836 | 5/2010 |
| JP | 2009-553658 | 6/2010 |
| JP | 2010-517000 | 10/2010 |
| JP | 2010-516999 | 12/2010 |
| JP | 2011-025711 | 8/2011 |
| KR | 10-2007-0022116 | 2/2007 |
| KR | 10-2007-0028080 | 3/2007 |
| KR | 10-2009-7016247 | 9/2009 |
| KR | 10-2009-7019501 | 2/2010 |
| KR | 10-2008-7029070 | 6/2011 |
| MX | 2007/005027 | 6/2007 |
| MX | 2008/013753 | 3/2009 |
| MX | 2009/004175 | 4/2009 |
| MY | PI 20084037 | 3/2007 |
| MY | PI 20091346 | 8/2011 |
| MY | PI 20093743 | 8/2011 |
| RU | 2008143336 | 5/2010 |
| RU | 2008146747 | 6/2010 |
| RU | 2009118955 | 11/2010 |
| RU | 2009135056 | 3/2011 |
| RU | 2010105052 | 8/2011 |
| RU | 2010105057 | 8/2011 |
| SG | 200702926-7 | 10/2005 |
| SG | 200807478-3 | 3/2007 |
| SG | 200902133-8 | 9/2007 |
| SG | 200906211-8 | 6/2008 |
| TW | 94138593 | 7/2006 |
| TW | 96111810 | 4/2007 |
| TW | 96111338 | 1/2008 |
| TW | 96108528 | 2/2008 |
| TW | 96136545 | 7/2008 |
| TW | 96139833 | 7/2008 |
| TW | 96148397 | 9/2008 |
| TW | 97122852 | 3/2009 |
| TW | 97126352 | 3/2009 |
| TW | 97126643 | 4/2009 |
| TW | 99112159 | 2/2011 |
| TW | 99113664 | 2/2011 |
| TW | 99113477 | 7/2011 |
| VN | 1-2009-01972 | 4/2010 |
| VN | 1-2008-02889 | 4/2011 |
| VN | 1-2009-01011 | 6/2011 |
| WO | WO 97/25834 A2 | 7/1997 |
| WO | WO 97/42789 | 11/1997 |
| WO | WO 01/31632 | 5/2001 |
| WO | WO 03/090208 A1 | 10/2003 |
| WO | WO 2004/019656 A2 | 3/2004 |
| WO | WO 2004/021332 | 3/2004 |
| WO | WO 2004/073178 A2 | 8/2004 |
| WO | WO 2004/098053 | 11/2004 |
| WO | WO 2004/111994 A2 | 12/2004 |
| WO | WO 2005/086139 A1 | 9/2005 |
| WO | WO 2006/019719 A1 | 2/2006 |
| WO | WO 2006/047600 | 5/2006 |
| WO | WO 2006/113047 A1 | 10/2006 |

OTHER PUBLICATIONS

International Search Report and Written Opinion for International Application No. PCT/US2013/033913 mailed on Mar. 11, 2014 in 22 pages.

Advanced Television Systems Committee Inc., ATSC Recommended Practice: Techniques for Establishing and Maintaining Audio Loudness for Digital Television, Document A/85:2011, Jul. 25, 2011 in 76 pages.

Australian Broadcasting Authority (ABA) *Investigation into Loudness of Advertisements* (Jul. 2002).

Digital Entertainment, Perceptual Loudness Management for Broadcast Applications, White Paper, 18 pages, Jun. 2010.

Glasberg et al., *A Model of Loudness Applicable to Time-Varying Sounds* (Journal of the Audio Engineering Society, Audio Engineering Society, New York, vol. 50, May 2002, pp. 331-342).

Hauenstein M., *A Computationally Efficient Algorithm for Calculating Loudness Patterns of Narrowband Speech* (Acoustics, Speech and Signal Processing, 1997 ICASSP-97 IEEE International Conference on Munich, Germany Apr. 21-24, 1997, Los Alamitos, CA, IEEE Comput. Soc., US, Apr. 21, 1997, pp. 1311-1314).

Immerseel et al., *Digital Implementation of Linear Gammatone Filters: Comparison of Design Methods*, (2003; 4(3):59-64, Acoustics Research Letters Online).

ISO226: 2003 (E) *Acoustics—Normal Equal Loudness Level Contours*.

International Telecommunication Union (ITU), Recommendation ITU-R BS.1770, Algorithms to Measure Audio Programme Loudness and True-Peak Audio Level (Questions ITU-R 2/6), 19 pages, 2006.

International Telecommunication Union (ITU), Recommendation ITU-R BS.1770-2, Algorithms to Measure Audio Programme Loudness and True-Peak Audio Level, 24 pages, Mar. 2011.

Junger White Paper, *Compressor and Expander*, 2011, in 1 page.
Junger White Paper, *High Definition 9624*, 2011, in 1 page.
Junger White Paper, *Audio Dynamics Processing*, 2011, in 2 pages.
Junger White Paper, *Level Magic*, 2011 in 1 page.
Junger White Paper, *Multiloop Technology Provides a Way to Integrate Loudness Control with Automation*, 2011 in 3 pages.
Junger White Paper, *Processing for Prior FM Transmission*, 2011, in 1 page.
Junger White Paper, *SDI Embedded Audio*, 2011, in 1 page.
Junger White Paper, *The Loudness Rollercoaster and How to Survive it*, 2011, in 2 pages.

Linear Acoustics, Product Guide Fall 2011, in 16 pages.

Lin, L., et al. *Auditory Filter Bank Design using Masking Curves* (7th European Conference on Speech Communication and Technology, Sep. 2001).

Lund, *Control of Loudness in Digital TV*, (2006 NAB BEC Proceedings, pp. 57-65).

Moore, et al., *A Model for the Prediction of Thresholds, Loudness and Partial Loudness* (Journal of the Audio Engineering Society, Audio Engineering Society, New York, vol. 45, No. 4, Apr. 1997, pp. 224-240).

Skovenborg et al., *Evaluation of Different Loudness Models with Music and Speech Material* (2004, 117th Convention of the Audio Engineering Society, San Francisco, CA USA).

Skovenborg et al., *Evaluation of Designs for Loudness-Matching Experiments* (2004, Poznan, Poland).

Stevens, *Calculations of the Loudness of Complex Noise* (Journal of the Acoustical Society of America 1956.

Zwicker, *Psychological and Methodical Basis of Loudness* (Acoustica, 1958).

Zwicker et al., *Psychoacoustics: Facts and Models* (Springer-Verlag, Chapter 8, "Loudness," pp. 203-238, Berlin Heidelberg, 1990, 1999).

International Search Report for International Application No. PCT/US2008/087791, mailed on Feb. 24, 2009.

(56) References Cited

OTHER PUBLICATIONS

Office Action issued in corresponding Japanese Application No. 2010-539900 on Jun. 12, 2012.
Extended Search Report issued in European application No. 08868264.6 on Sep. 12, 2012.
Khalil C. Haddad, et al., Design of Digital Linear-Phase FIR Crossover Systems for Loudspeakers by the Method of Vector Space Projections, Nov. 1999, vol. 47, No. 11, pp. 3058-3066.
Office Action issued in Korean application No. 10-2010-7014611 on Aug. 31, 2015.
Advanced Television Systems Committee Inc., ATSC Recommended Practice: Techniques for Establishing and Maintaining Audio Loudness for Digital Television, Document A/85:2011,May 25, 2011.
Anderton, Craig, "DC Offset: The Case of the Missing Headroom" Harmony Central. http://www.harmonycentral.com/docs/DOC-1082, Apr. 19, 2010.
Extended Search Report issued in European Application No. 09848326.6 on Jan. 8, 2014.
Hu et al. "A Perceptually Motivated Approach for Speech Enhancement", IEEE Transactions on Speech and Audio Processing, vol. 11, No. 5, Sep. 2003.
ITU-R Radio Sector of ITU, Recommendation ITU-R BS. 1770-2, Algorithms to Measure Audio Programme Loudness and True-Peak Audio Level, 24 pages, Mar. 2011.
P1 Audio Processor, White Paper, May 2003, Safe Sound Audio 2003.
Poers, The Loudness Rollercoaster, Jünger Loudness Control Devices, 2 pages, http://junger-audio.com/technology/the-loudness-rollercoaster/.
Recommendation ITU-R-BS. 1770, Algorithms to measure audio programme loudness and true-peak audio level, pp. 1-19, 2006.
Roger Derry, PC Audio Editing with Adobe Audition 2.0 Broadcast, desktop and CD audio production, First edition 2006, Eisever Ltd.
Schottstaedt, SCM Repositories—SND Revision 1.2, Jul. 21, 2007, SourceForge, Inc.
Seefeldt, et al. A New Objective Measure of Perceived Loudness, (Audio Engineering Society, Convention Paper 6236, 117th Convention, San Francisico, CA Oct. 28-31, 2004).
Japanese Office Action mailed Feb. 26, 2013, Japanese Application No. 2012-524683.
Office Action issued in Chinese Application No. 200880121963.X on Aug. 14, 2013.
Office Action issued in Chinese Application No. 200880121963 on Apr. 30, 2014.
Office Action issued in Chinese Application No. 200980160873.6 on Oct. 23, 2013.
Office Action issued in corresponding Japanese Application No. 2012-524683 on Feb. 26, 2014.
International Preliminary Report on Patentability issued in application No. PCT/US2009/053437 on Feb. 14, 2012.
International Search Report and Written Opinion in PCT/US2009/053437, Oct. 2, 2009.
International Search Report and Written Opinion in PCT/US2009/056850, Nov. 2, 2009.
International Search Report and Written Opinion issued in Application No. PCT/US2012/048378 on Jan. 24, 2014.

\* cited by examiner

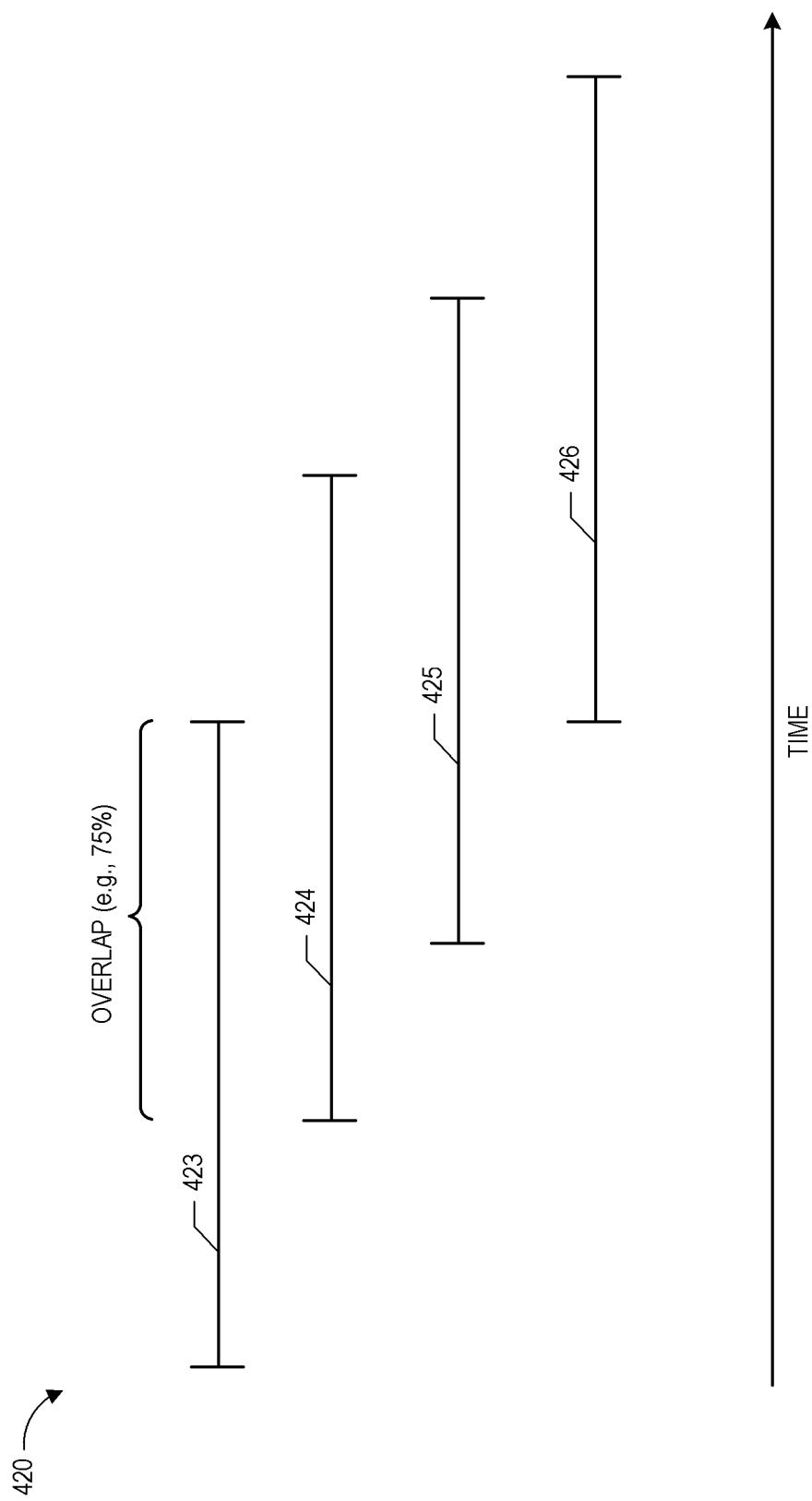

SYSTEM FOR ADJUSTING LOUDNESS OF AUDIO SIGNALS IN REAL TIME

CROSS-REFERENCE TO RELATED APPLICATIONS

This application is a continuation of U.S. application Ser. No. 13/445,769, filed Apr. 12, 2012, entitled "System for Adjusting Loudness of Audio Signals in Real Time," the disclosure of which is hereby incorporated by reference in its entirety.

BACKGROUND

One complaint voiced by many television viewers is the changes in volume viewers endure during commercial breaks and when switching between different channels. Similar volume extremes may also occur with other devices, such as portable audio players, A/V receivers, personal computers, and vehicle audio systems. One solution for this problem is automatic gain control (AGC). A typical automatic gain control (AGC) works by reacting to volume changes by cutting an audio signal at high amplitude and then boosting it at low amplitude—no matter where in the frequency range the loudness spike occurs.

When the AGC kicks in, unwanted changes and unnatural artifacts can often be heard in the form of pumping and breathing fluctuations. Pumping fluctuations can be the result of bass tones disappearing when the loudness suddenly increases, like during a loud action sequence. Breathing fluctuations can happen when low level hiss is boosted during quiet passages. Unfortunately, this brute force method of handling volume changes does not take into account how humans actually perceive change in volume.

SUMMARY

In certain embodiments, a method for adjusting loudness of an audio signal can include receiving an audio signal and dividing the audio signal into a plurality of frames. The method can include for a frame of the plurality of frames, by one or more processors, measuring initial loudness values for blocks of samples in the frame to produce a plurality of initial loudness values. The method can also include computing a weighted average of at least some of the initial loudness values in the frame to produce an adjusted loudness value for the frame. The weights in the weighted average can be selected based at least partly on one or both of recency of the initial loudness values and variation of the initial loudness values. The method can further include adjusting loudness of the audio signal based at least partly on the adjusted loudness value.

In various embodiments, a system for adjusting loudness of an audio signal can include a loudness analysis module comprising one or more processors. The loudness analysis module can access a frame of an audio signal, the frame comprising a plurality of samples of the audio signal and measure loudness values for windows of the samples in the frame to produce a plurality of loudness values. The loudness analysis module can further compute a weighted average of at least some of the loudness values to produce an adjusted loudness value. The weights in the weighted average can be selected based at least partly on one or more of the following: timing of the loudness values and deviation of the loudness values. The system for adjusting loudness can also include a dynamics control module configured to adjust loudness of the audio signal based at least partly on the adjusted loudness value.

In certain implementations, a method of adjusting loudness of an audio signal can include sampling an audio signal to produce blocks of samples, measuring initial loudness values for the blocks of samples in the audio signal to produce a plurality of initial loudness values, and computing gain values to be applied to the audio signal based at least partly on the initial loudness values. The method can also include computing a weighted average of the initial loudness values or of the gain values. The weights in the weighted average can be selected based at least partly on one or both of recency and variation of the initial loudness values or the gain values. The method can further include adjusting loudness of the audio signal based at least partly on the computed gain values and the weighted average.

For purposes of summarizing the disclosure, certain aspects, advantages and novel features of the inventions have been described herein. It is to be understood that not necessarily all such advantages may be achieved in accordance with any particular embodiment of the inventions disclosed herein. Thus, the inventions disclosed herein may be embodied or carried out in a manner that achieves or optimizes one advantage or group of advantages as taught herein without necessarily achieving other advantages as may be taught or suggested herein.

BRIEF DESCRIPTION OF THE DRAWINGS

Throughout the drawings, reference numbers may be re-used to indicate correspondence between referenced elements. The drawings are provided to illustrate embodiments of the inventions described herein and not to limit the scope thereof.

FIG. 4B illustrates a chart showing example of overlapping segments of audio signals;

DETAILED DESCRIPTION

Overview

Figure 1:
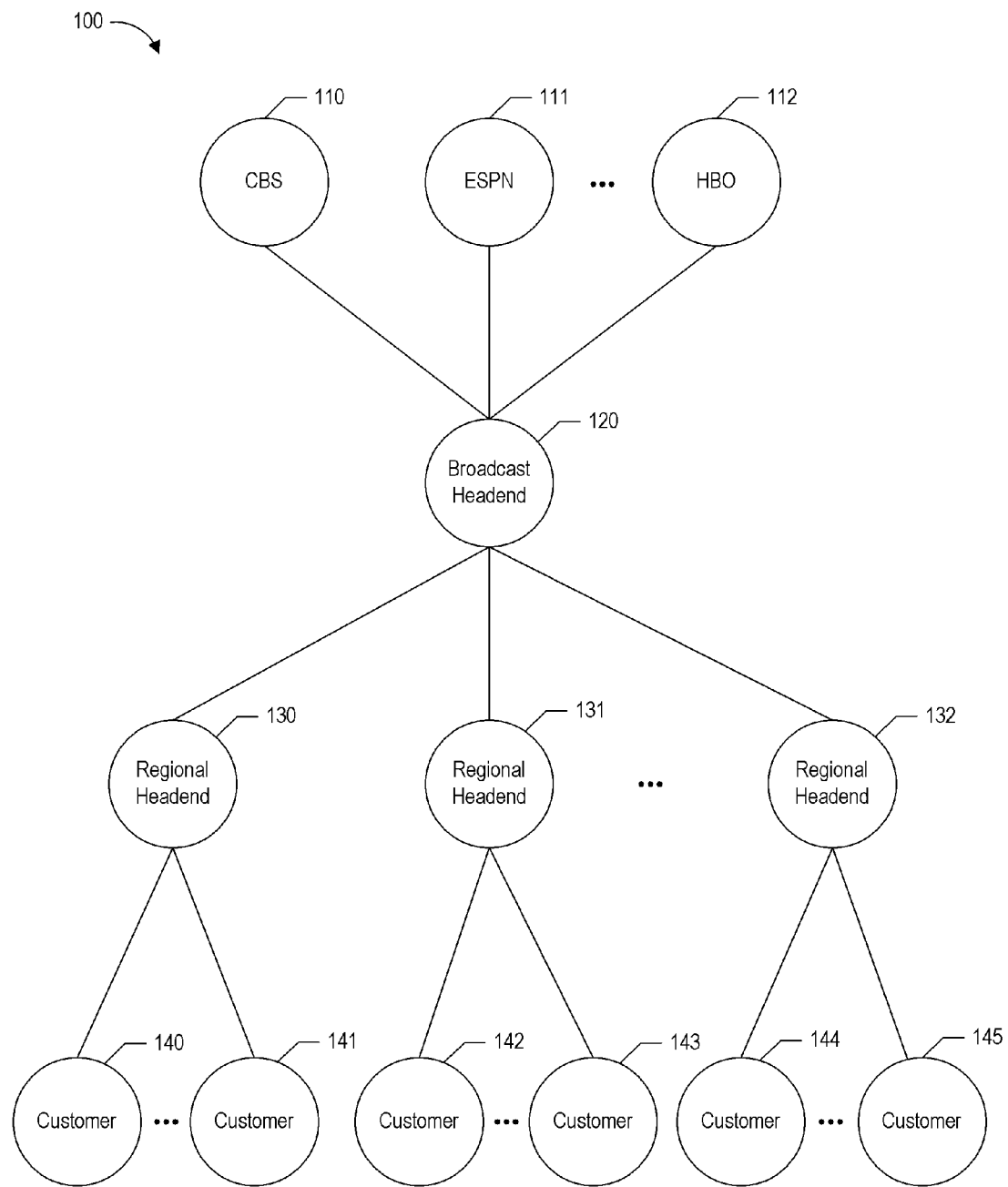
FIG. 1 illustrates an embodiment of a broadcast system.

Existing regulations, such as the Commercial Advertisement Loudness Mitigation Act (CALM Act), require broadcast and cable television stations to adopt industry technology standards that ensure that commercials are not louder than regular programming. Some volume control systems attempt to take loudness of an audio signal into account in determining how to vary gain. Loudness can be an attribute of the auditory system that can allow for classification of sounds on a scale from quiet to loud. Loudness can be measured in decibels or other units (such as the phon).

Audio and audiovisual programming, such as television programming, Internet streaming, and the like can be provided or streamed by content providers to a broadcasting center (which can be referred to as a broadcast head end). Some programming may be live, and such programming is broadcast to viewers live. Other programming, although not live programming, is streamed to the broadcasting center, and can be processed there in real time. Typically, compressed programming is provided, although programming may be provided in any form, such as uncompressed or a mix of compressed and uncompressed programming. The programming can include commercials, and loudness of the commercials may need to be adjusted in order to comply with the regulations. It can be advantageous to perform the adjustment in real time without having access to the entire program (e.g., entire episode of a TV show, entire news broadcast, entire movie, etc.)

This disclosure describes certain systems and methods for adjusting loudness of audio signals in real time. Techniques used by these systems and methods can include performing weighting of loudness measurements based on various criteria to more accurately track transient loudness spikes. Additional techniques can include increasing the size of an adaptive analysis window of the audio signal when feasible to reduce the impact of loudness on dynamic range. Further, these techniques can include adaptively discarding selected loudness measurements to reduce the impact of noise and low-level signals that may represent silence on loudness adjustments. Moreover, techniques for detecting information content of an audio signal can be employed to enable loudness adjustment of the information-bearing portions.

Advantageously, in certain embodiments, applying one or more of these techniques can preserve or attempt to preserve the transparency of loudness adjustments to the audio signal while preserving the ability to react quickly to changes in the loudness. Transparency can relate to a degree or measure of perceptual difference between the original audio signal and an audio signal with adjusted loudness. Higher transparency can reflect the fact that the audio signal is substantially perceptually indistinguishable from the original audio signal. In some embodiments, applying one or more of the above-described features can also reduce the impact of loudness adjustments on the dynamic range of the audio signal.

In addition to having its ordinary meaning, the terms "real time," "real time processing," and the like can refer to any form of processing other than file-based processing. File-based processing, in the loudness adjustment context, can refer to loudness processing performed on an entire audio file or audio program at once, for example, by calculating an overall loudness of an entire program and adjusting the loudness accordingly. As another example, file-based processing can refer to loudness processing performed offline, such as in the context of video on demand (VOD) processing, audio and video on demand (AVOD) processing, etc. The terms "real time," "real time processing," and the like can, but need not, necessarily refer to processing performed without a perceptible delay from the point of view of a listener. Further, these terms can be need not refer to programming that is broadcast live. Rather, any programming can be broadcast and therefore adjusted for loudness in real time, including programming that has been stored as a file.

Example Loudness Adjustment System

Referring to FIG. 1, an embodiment of a broadcast system 100 is shown. As is shown, one or more content providers 110, 111, and 112 deliver television programming to a broadcast head end 120. In some embodiments, the broadcast head end 120 can be a facility for receiving television signals for processing and distribution over a television system. Processing may include recoding encoded and/or compressed content received from a content provider, aggregating or combining content for distribution downstream, inserting commercials, and so on. Broadcast head end 120 can operate automatically without user intervention or operate with user intervention. Content processed by the broadcast head end 120 can be distributed to one or more regional head ends 130, 131, and 132. A regional head end can perform further processing of the content, including insertion of commercials targeted for a specific region or locale. As is illustrated, the regional head end distributes final programming to one or more customers 140-145. The broadcast head end 120 and/or regional head ends 130-132 may include one or more processing devices, such as receivers and/or servers.

In some embodiments, the broadcast head end 120 broadcasts programming in real time, near-real time, or the like. For example, the broadcast head end 120 may not have access to the entire program before operating on the program, instead broadcasting the program as it is received from a content provider. As is explained above, storing or buffering the entire program (e.g., as a digital file) before processing the program can be considered a file-based operation. Processing performed by the regional head ends may be file-based, real time, or a combination of file-based and real time processing.

Figure 2A:
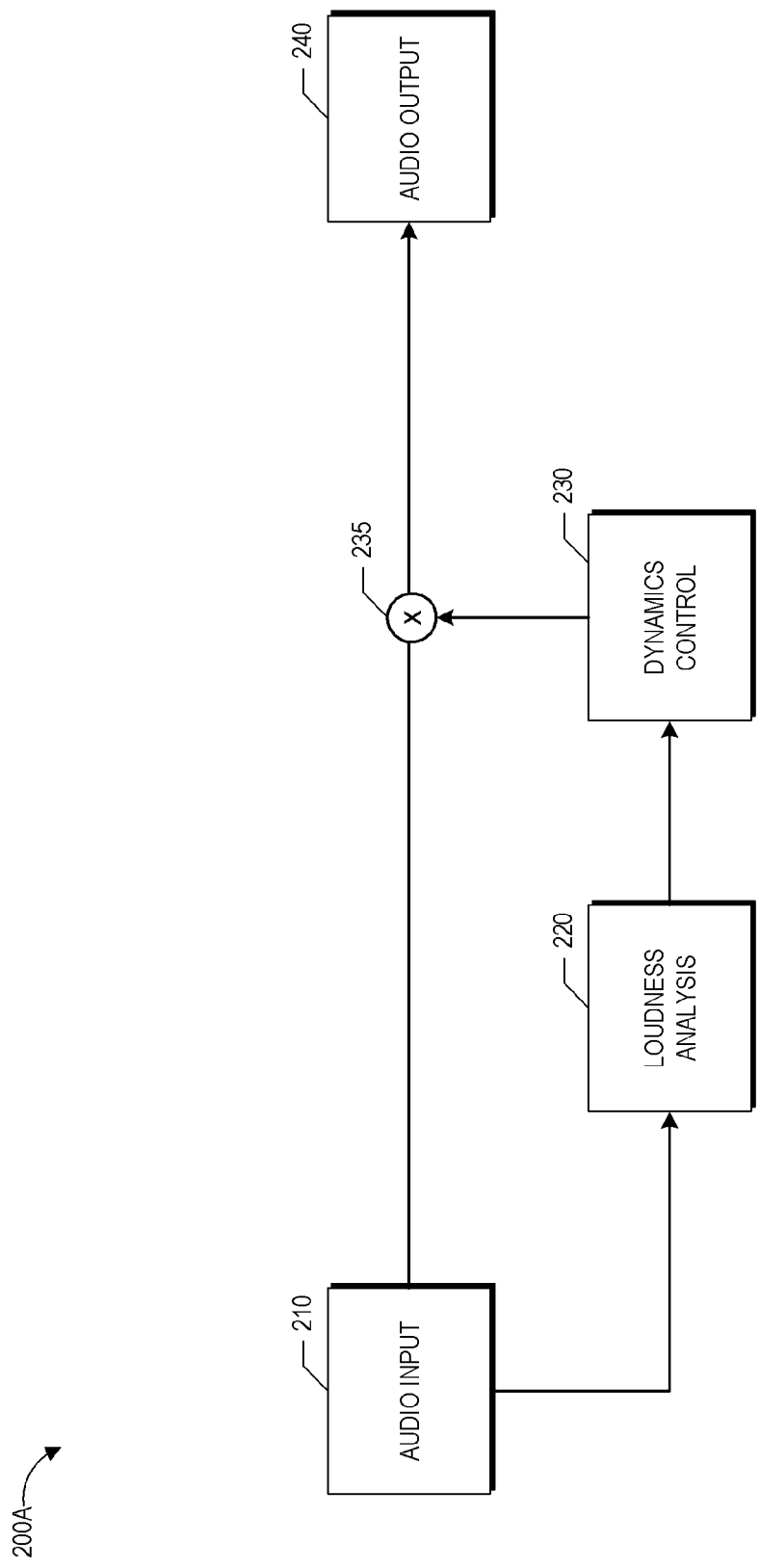
FIG. 2A illustrates an embodiment of a system for adjusting the loudness of audio signals in real time.

Referring to FIG. 2A, an embodiment of an audio processing system 200A for adjusting the loudness of audio signals in real time is shown. The audio processing system 200A may be implemented in any machine that processes and/or reproduces audio, such as a head end device (e.g., a receiver, server, computer, and the like) or a user device (e.g., a computer, set top box, television, portable audio player, headphone, A/V receiver, vehicle audio system, and the like). Although in some embodiments the audio processing system 200A is implemented by a broadcast head end 120, the audio processing system 200A can be implemented by a regional head end 130-132 or any other machine that processes and/or reproduces audio. Advantageously, in certain embodiments, the audio processing system 200A adjusts a loudness of an audio input signal 210 to attempt to maintain the loudness at a certain level. For example, the audio processing system 200A may attempt to maintain a certain loudness of television audio when a commercial begins broadcasting. The audio processing system 200A can perform these functions in real time.

As shown in FIG. 2A, the audio processing system 200A receives an audio input signal 210. The audio input signal 210 can include one or more channels. For instance, two channels, such as stereo channels, 5.1, 6.1, or 7.1 surround sound channels, or matrix encoded channels such as Circle Surround encoded channels or the like may be provided. The audio input signal 210 can be an electrical signal or the like that represents a real, physical sound, such as music, voice, effects, combinations of the same, and the like.

The loudness analysis module 220 can include hardware and/or software for determining or estimating loudness of the audio input signal 210 in real time. In certain embodiments, the loudness analysis module 220 implements one or more loudness estimating techniques described in the following standards: Advanced Television Systems Committee, Inc.'s ATSC A/85, International Telecommunications Union's ITU BS.1770-1, and International Telecommunications Union's ITU BS.1770-1-2. Each of the ATSC A/85, ITU-R BS.1770-1, and ITU-R BS.1770-1-2 standards are hereby incorporated by reference in their entirety. For example, ITU-R BS.1770-1 and BS.1770-2 standards disclose determining loudness by integrating (or summing in the discrete time domain) weighted power of the audio signal channels over the duration of the audio signal, among other techniques that can be used by the loudness analysis module 220.

The dynamics control module 230 can include hardware and/or software for comparing the estimated loudness provided by the loudness analysis module 220 with a reference or target loudness level. The target loudness level can be a reference that is internal to the audio processing system 200A. For example, the target level can be full scale loudness (e.g., 0 dB), so that adjusting the loudness to this level preserves the dynamic range of the audio output signal 240. In another embodiment, the target level can be any level chosen by an operator or user at the head end. If the estimated loudness differs from the target loudness level, the dynamics control module 230 can determine the level difference between the estimated loudness and the target loudness level. The dynamics control module 230 can further use this difference to adjust a gain applied to the audio input signal 210. The audio processing system 200A outputs an audio output signal 240, which has it loudness adjusted. The audio output signal 240 may be distributed to regional head ends 130-132 (in case the audio processing system 200A is implemented by the broadcast head end 120), or the audio output signal 240 may be distributed directly to customers (in case the audio processing system 200A is implemented by a regional head end 130-132).

The dynamics control module 230 can apply the loudness level difference (e.g., reflected as the gain) to the audio signal input 210 on a sample by sample basis via a mixer 235. For example, the dynamics control module 230 can compute the multiplicative inverse of the loudness level to determine the gain and apply the gain to the audio signal input 210. In certain embodiments, when more than one channel of audio input is provided, the dynamics control module can utilize more than one mixer 235 in order to apply the level difference to more than one channel. In certain embodiments, the dynamics control module 230 smoothes transitions between samples or blocks of samples of the audio input signal 210 to prevent jarring loudness transitions. In other embodiments, such smoothing is performed by weighing the loudness values as is described below. As a result, the mixer 235 may output or attempt to output an audio signal 240 that has a constant average loudness level or substantially constant average loudness level. In other embodiments, the loudness level of the output audio signal 240 may not be constant, but may still have less variability than the audio signal input 210. Thus, in certain embodiments, the audio processing system 200A can transform the audio input signal 210 into an audio output signal 240 that has a less variable loudness level than the audio input signal.

In some embodiments, a pre-processing module (not shown) may be included by the audio processing system 200A. The pre-processing module can be configured to receive the audio input signal 210. The pre-processing module may include hardware and/or software for gathering energy information from a channel (or each channel) of the audio input signal 210. The pre-processing module can be further configured to examine noise characteristics of the channel(s). Using the energy information and/or noise characteristics in one embodiment, the pre-processing module can determine at least one dominant channel to be analyzed for loudness by a loudness analysis module 220. More generally, the pre-processing module may select a subset of the channels of the audio input signal 210 for loudness analysis. In certain embodiments, using fewer than all of the channels to determine loudness can reduce computing resources used to determine loudness.

Figure 2B:
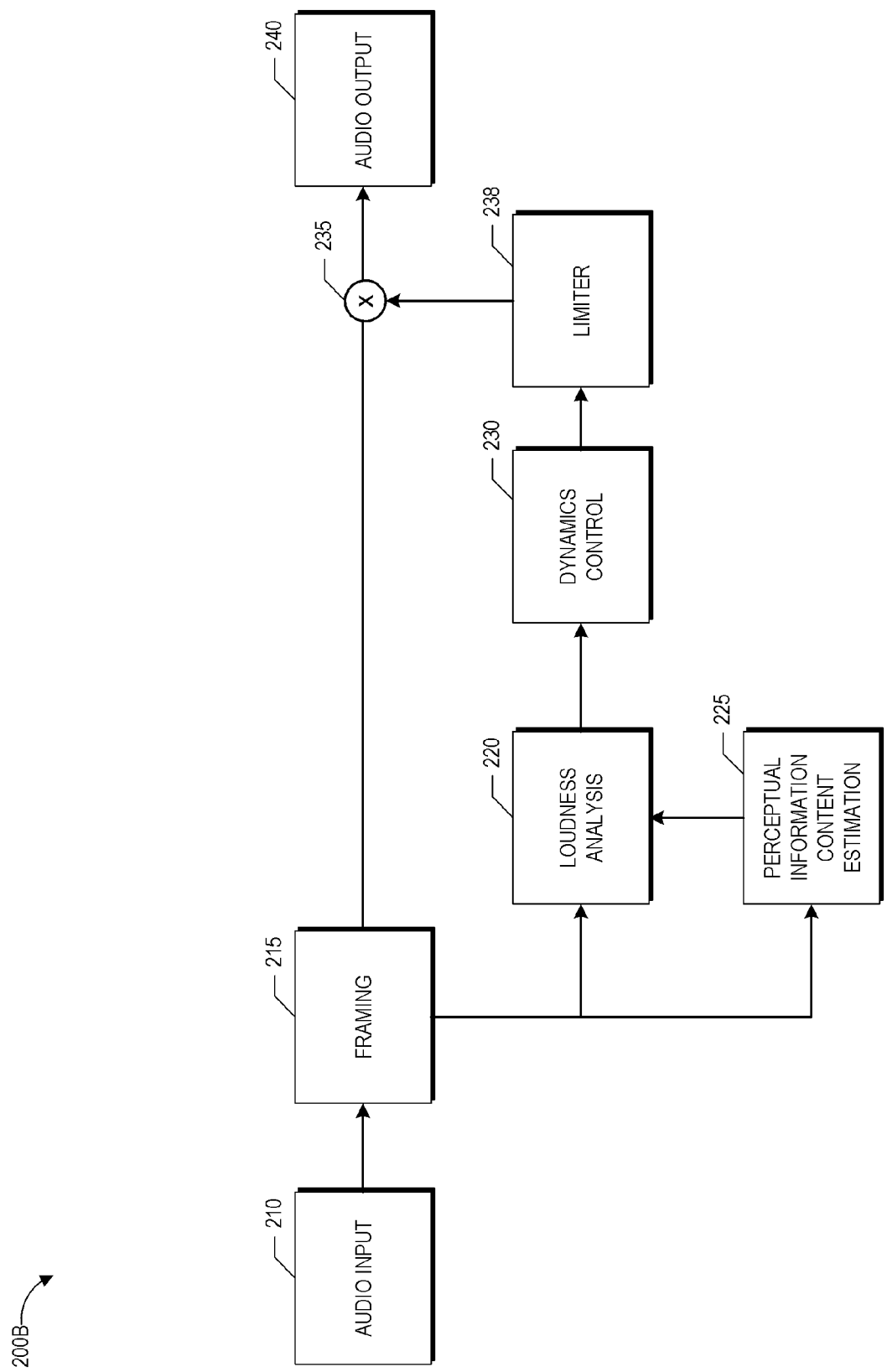
FIG. 2B illustrates another embodiment of a system for adjusting the loudness of audio signals in real time.

FIG. 2B illustrates another embodiment of an audio processing system 200B for adjusting the loudness of audio signals in real time. The audio processing system 200B may be implemented in any machine that processes and/or reproduces audio, such as a head end device (e.g., a receiver, server, computer, and the like) or a user device (e.g., a computer, set top box, television, portable audio player, headphone, A/V receiver, vehicle audio system, and the like). Although in some embodiments the audio processing system 200B is implemented by a broadcast head end 120, the audio processing system 200B can be implemented by a regional head end 130-132 or any other machine that processes and/or reproduces audio. Advantageously, in certain embodiments, the audio processing system 200B adjusts a loudness of an audio input signal 210 to maintain or attempt to maintain the loudness at a certain level. For example, the audio processing system 200B may attempt to maintain a certain loudness of television audio when a commercial begins broadcasting. The audio processing system 200B can perform these functions in real time.

As is described above, the audio processing system 200A receives an audio input signal 210. Further, as is described above, a pre-processing module (not shown) may be included may be included in some embodiments. The dynamics control module 230 can include hardware and/or software for comparing a gated measured loudness 365 provided by the loudness analysis module 220 with a reference loudness level. The reference loudness level can be a reference that is internal to the audio processing system 200B. For example, the reference level can be set by a head end operator, such as to −24 dB, −20 dB, 0 dB (or full scale loudness, so that adjusting the loudness to this level preserves the dynamic range of the audio output signal 240), or another suitable value. If the estimated loudness differs from the reference loudness level, the dynamics control module 230 can determine the level difference between the estimated loudness and the reference level. The dynamics control module 230 can further use this difference to adjust a gain to be applied to the audio input signal 210.

The dynamics control module 230 can provide the determined gain or the level difference to a limiter module 238. The limiter module 238 prevents or reduces clipping of the audio input signal 210 by reducing the computed gain to be applied to the signal 210 so that the peak amplitude of the gain-adjusted signal may be below a clipping threshold. The audio processing system 200B outputs the audio output signal 240, which has it loudness adjusted. The audio output signal 240 may be distributed to regional head ends 130-132 (in case the audio processing system 200B is implemented by the broadcast head end 120), or the audio output signal 240 may be distributed directly to customers (in case the audio processing system 200B is implemented by a regional head end 130-132). The limiter module 238 can apply the loudness level difference (e.g., reflected as the gain) to the audio signal input 210 on a sample by sample basis via the mixer 235. In certain embodiments, e.g., when more than one channel of audio input is provided, the limiter module 238 can utilize more than one mixer 235 in order to apply the level difference to more than one channel.

In certain embodiments, the dynamics control module 230 and/or the limiter module 238 smoothes transitions between samples or blocks of samples of the audio input signal 210 to prevent jarring loudness transitions. In other embodiments, such smoothing is performed by weighing the loudness values as is described below. As a result, the mixer 235 may output or attempt to output an audio signal 240 that has a constant average loudness level or substantially constant average loudness level. In other embodiments, the loudness level of the output audio signal 240 may not be constant, but may still have less variability than the loudness of the audio signal input 210. Thus, in certain embodiments, the audio processing system 200B can transform the audio input signal 210 into an audio output signal 240 that has a less variable loudness level than the audio input signal.

The framing module 215 can include hardware and/or software for buffering a segment of the audio input signal 210 for real time processing. In some embodiments, the audio input signal 210 is a stream of a television program, an Internet stream, etc. and the framing module 215 can buffer a segment of the television program. The segment may contain a plurality of samples. In certain embodiments, the length of the frame is 12 seconds or approximately 12 seconds, although different frame lengths can be utilized, such as less than 12 seconds or more than 12 seconds, e.g., 20 seconds, 30 seconds, 45 seconds, 60 seconds, etc. In some embodiments, the length of the frame can be adjusted or varied as is described below.

Figure 3A:
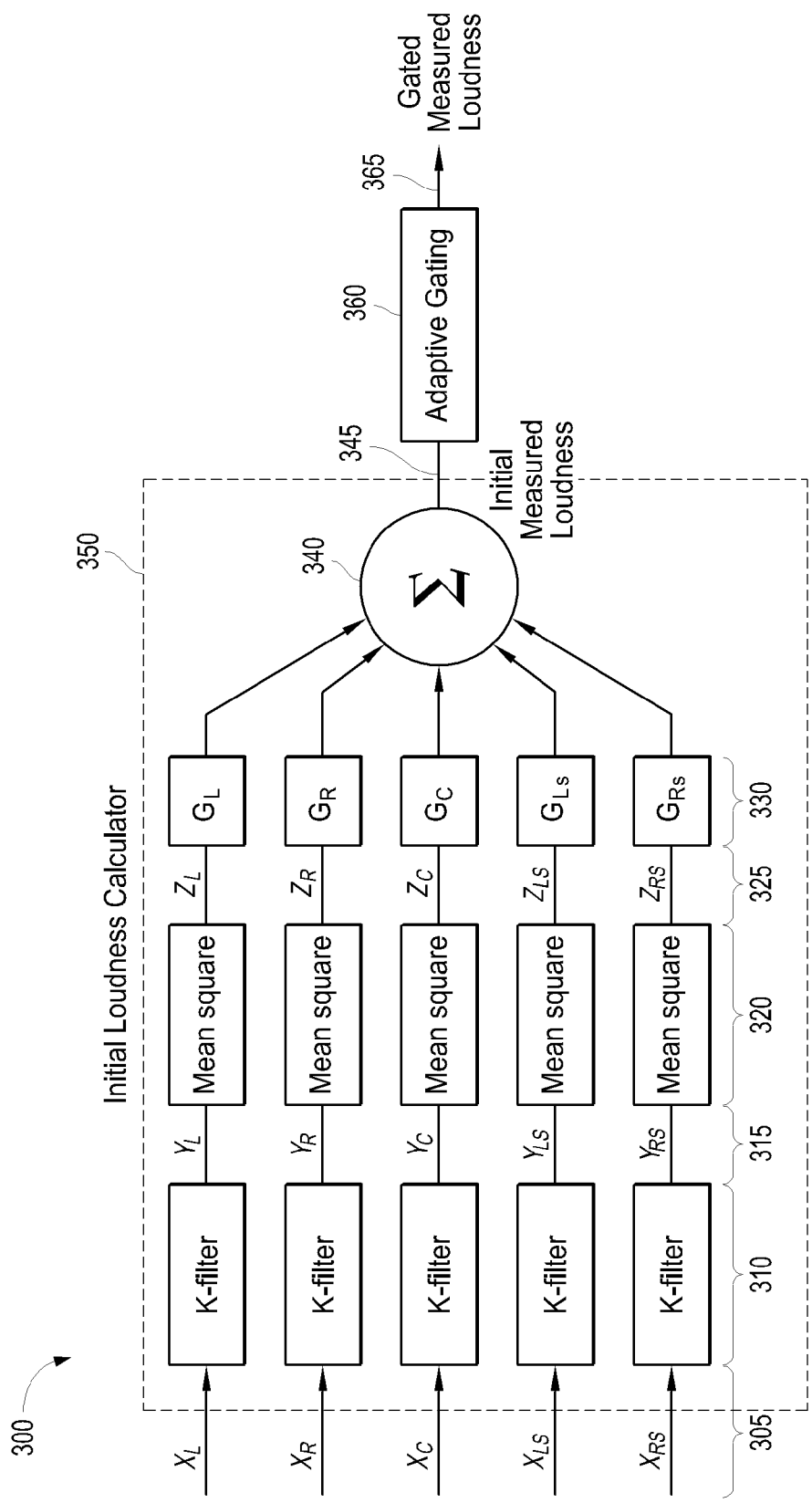
FIG. 3A illustrates an embodiment of a system for determining loudness of audio signals in real time.

The loudness analysis module 220 can include hardware and/or software for determining or estimating loudness of the audio input signal 210 in real time. In certain embodiments, the loudness analysis module 220 implements one or more loudness estimating techniques described in the ITU-R BS.1770-2 standard, incorporated above. With reference to FIG. 3A, in some embodiments, the loudness analysis module 220 can include a system 300 for determining loudness of audio signals in real time. As is illustrated, the loudness determination system 300 can operate on multiple channels 305 of the framed audio input signal 210, such as left channel (L), right channel (R), center channel (C), left surround (Ls), and right surround (Rs). In other embodiments, the loudness determination system 300 can operate on fewer or greater number of channels and/or on channels different than those illustrated in FIG. 3A.

Figure 3B:
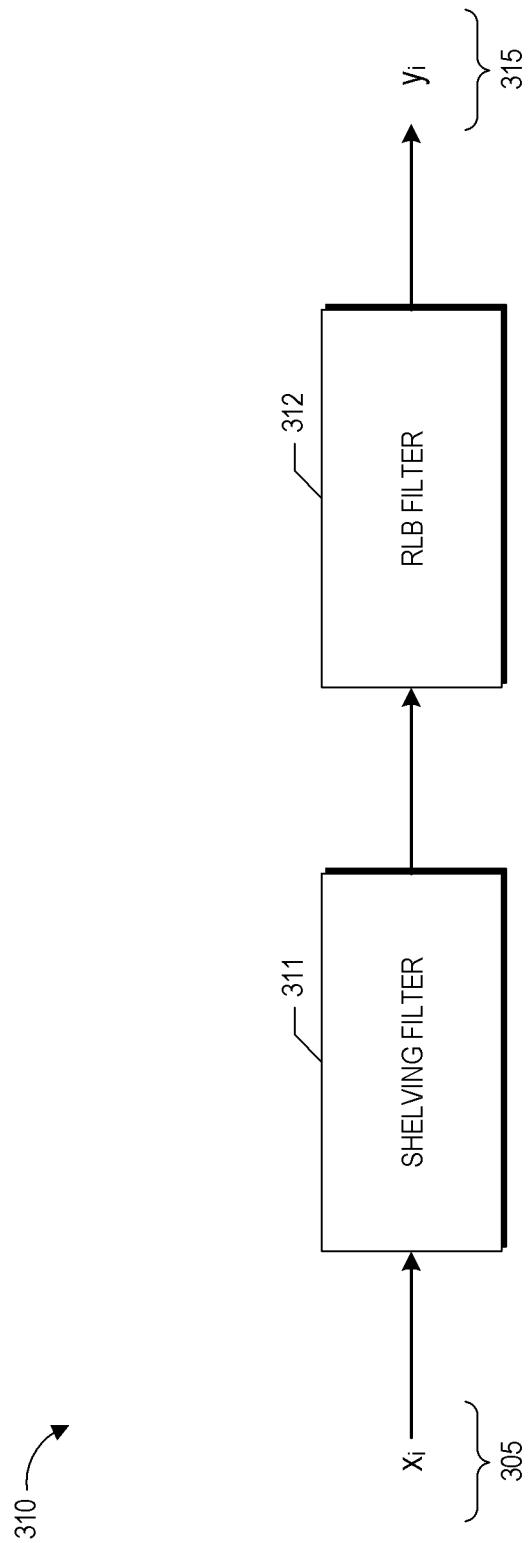
FIG. 3B illustrates an embodiment of a frequency weighting filter.
Figure 3C:
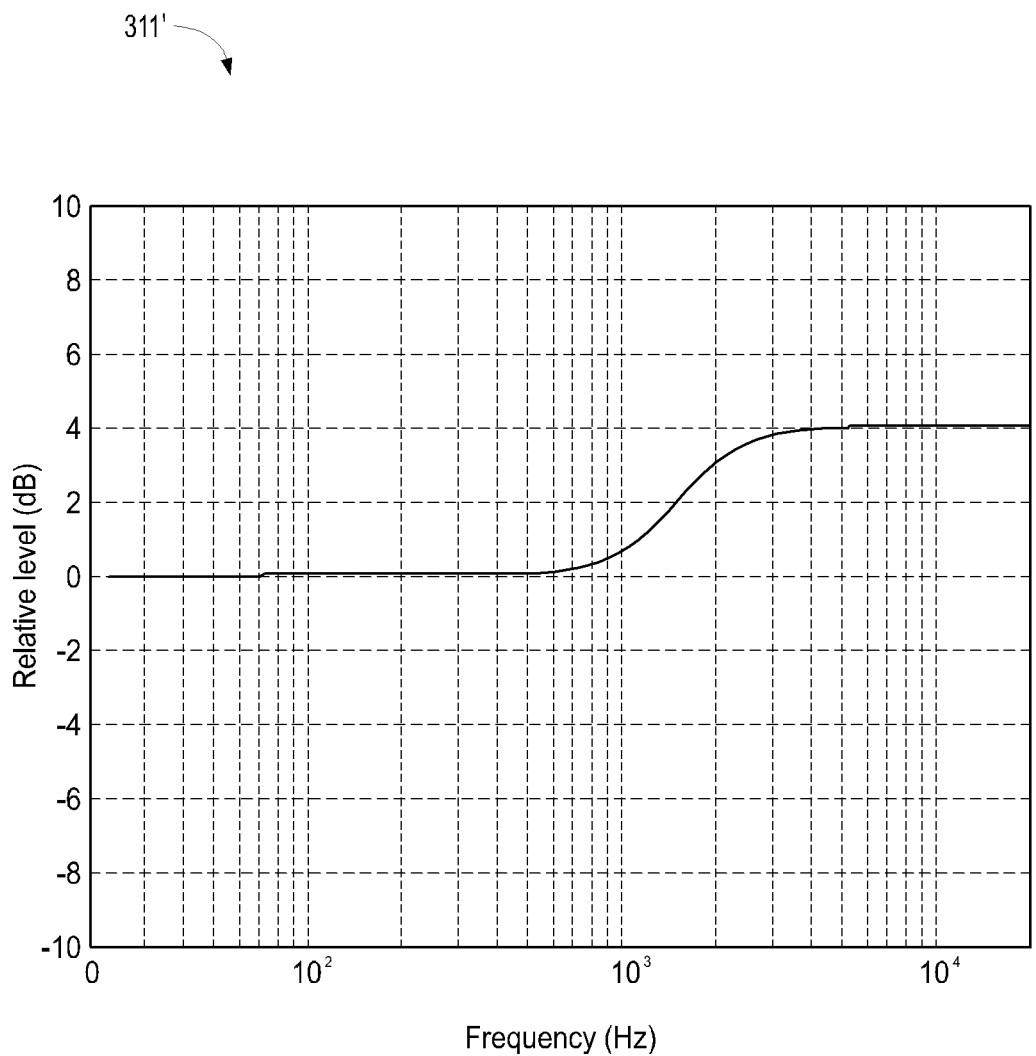
FIGS. 3C-3D illustrate example frequency responses of filters of FIG. 3B.
Figure 3D:
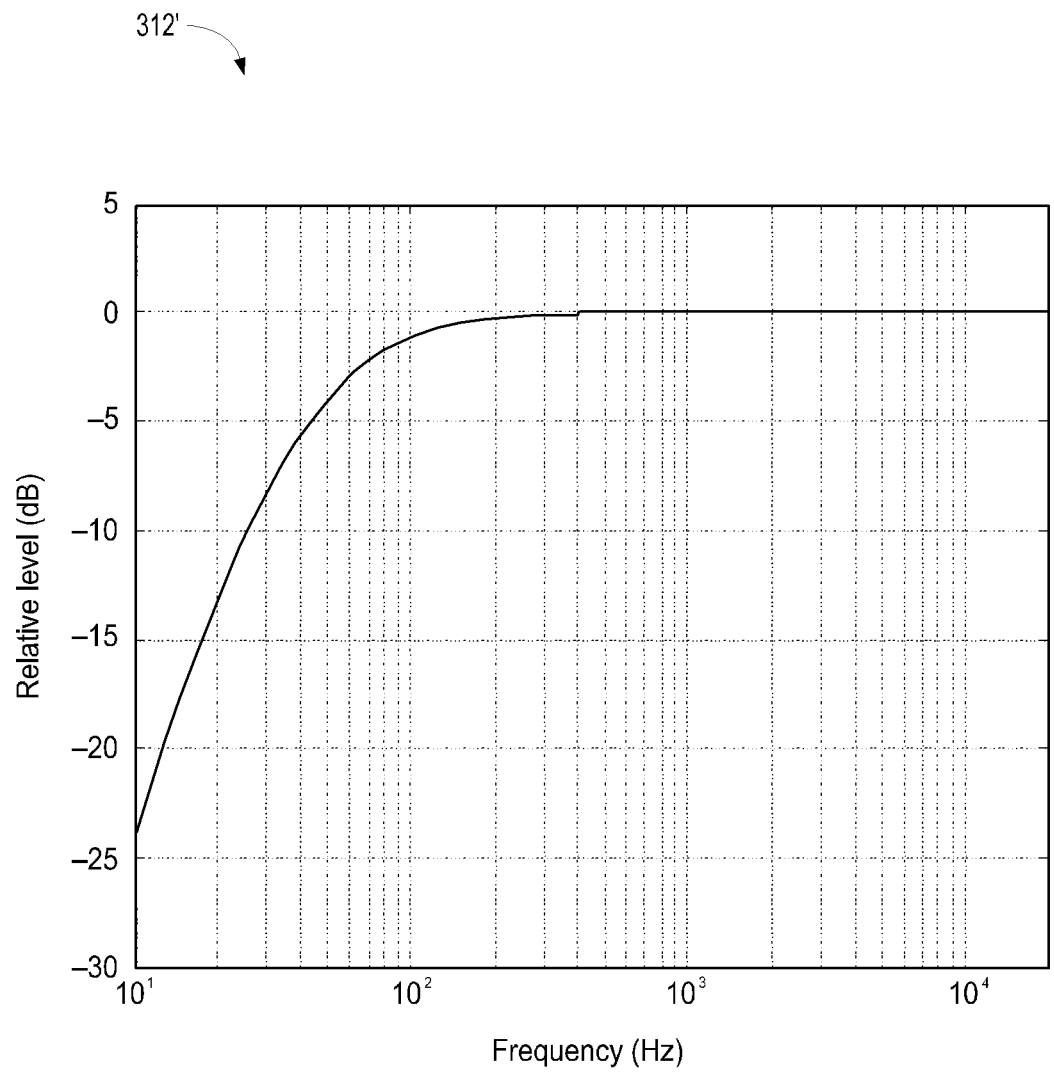

The loudness determination system 300 applies filtering 310 of the audio input signal 305. As is illustrated, filtering 310 can be applied to each channel 305 of the framed audio input signal 210. In certain embodiments, filtering 310 performs two-stage frequency weighting of the audio input signal 305, as is illustrated in FIG. 3B. The first filtering stage 311 can account for the acoustic effects of a human head modeled as a rigid sphere. The impulse response 311' of the first stage filter 311 is shown in FIG. 3C. As is illustrated, in one embodiment, first stage filter 311 is a shelving filter or an equalizer configured to boost higher frequencies (e.g., provide treble boost). The coefficients of the first stage filter 311 are provided on page 4 of ITU-R BS.1770-1-2 standard (March 2011 edition). With reference to FIG. 3B, the second filtering stage 312 applies a revised low-frequency B-weighting weighting curve (RLB weighting curve). The impulse response 312' of the second stage RLB weighting filter 312 is shown in FIG. 3D. As is illustrated, in one embodiment, second stage filter 312 is a high pass filter. The coefficients of the second stage filter 312 are provided on page 5, of ITU-R BS.1770-1-2 standard (March 2011 edition).

With reference to FIG. 3A, filtered channel(s) 315 can be provided to the power calculator module 320, which computes the mean square value(s) 325 or average power of the filtered input signal. In certain embodiments, the power calculator module 320 computes the mean square value according to the following equation or some variation thereof:

$$z_i = \frac{1}{N}\sum_{0}^{N-1} y_i^2 \qquad (1)$$

where N is the duration or interval (e.g., number of samples in one frame) of the audio input signal 210. The loudness determination system 300 can calculate initial measured loudness 345 over the length of the frame (which can be measured by the interval N) according to the following equation or some variation thereof (including a logarithmic version of at least a portion thereof):

$$\text{Loudness, } L = -0.691 + \sum_{0}^{N-1} G_i \cdot z_i \qquad (2)$$

where $G_i$ are weighting coefficient(s) 330 for the channels 325. Thus, initial measured loudness 345 can be calculated by summing 340 the mean square value(s) 325 and (optionally) scaling the sum by a constant (−0.691). In one embodiment, weighting coefficients 330 can be selected as follows: $G_L$=1.0 (0 dB), $G_R$=1.0 (0 dB), $G_C$=1.0 (0 dB), $G_{Ls}$=1.41 (~1.5 dB), and $G_{Rs}$=1.41 (~1.5 dB). Other suitable values of weighting coefficients 330 may be used. In one embodiment, initial measured loudness 345 can be expressed in units called "LKFS," which refer to loudness, K-weighted, relative to full scale. If a logarithm is taken of the summation in equation (2), the loudness can be expressed in decibels. For example, if a 0 dB full-scale sine wave with frequency of 1 kHz is used as the audio input 210, its loudness will equal −3.01 LKFS. However, the loudness need not be expressed in decibels in some embodiments.

To calculate the gated measured loudness 365 in some embodiments, the loudness determination system 300 can divide or partition each frame of the audio input signal 210 into a set of overlapping windows or blocks. In one embodiment, the windows can be of equal length (although this is not required), and the overlap can be 75%. This is illustrated in FIG. 4B, which shows a chart 420 of overlapping windows of audio signals according to one embodiment. The windows 423, 424, 425, and 426 overlap by 75% of their length or approximately 75% of their length. In another embodiment, a different overlap may be used, such as 10%, 25%, 50%, or the like. In an embodiment, the duration of windows 423, 424, 425, and 426 is 400 msec or approximately 400 msec to the nearest sample. In another embodiment, different duration can be selected, such as 100 msec, 150 msec, 200 msec, and so on. The selection of window duration and/or the overlap may depend on the sampling rate of the audio input signal 210. For example, 400 msec may be a suitable window length for 48 kHz sampling rate of the audio input signal 210. In certain embodiments, as is described below, filtering 310 and power calculation 320 operations can be performed on the overlapping windows. In other words, the loudness determination system 300 can determine initial measured loudness values 345 for each of the overlapping windows. In certain embodiments, frames of the audio input signal 210 can also be overlapped as described above, such that sliding frames of the audio input signal 210 are analyzed.

The power calculator module 320 can compute the mean square values for each overlapping window according to the following equation:

$$z_{ij} = \frac{1}{N} \sum_{N_g \cdot j \cdot step}^{N_g \cdot (j \cdot step+1)} y_i^2 \qquad (3)$$

where $z_{ij}$ is the mean square value of the jth interval (or frame) of the ith channel of the audio input signal 210, step equals to (1-overlap), $N_g$ is duration (e.g., number of samples) in a sub-frame, and j is selected from the set of values $$\left[0, 1, 2, \ldots, \frac{N - N_g}{N_g \cdot step}\right].$$

The initial measured loudness 345 of jth sub-frame can be calculated according to the following equation or the like:

$$L_j = -0.691 + \sum_0^{N-1} G_i \cdot z_{ij} \qquad (4)$$

Adaptive Gating

Figure 4A:
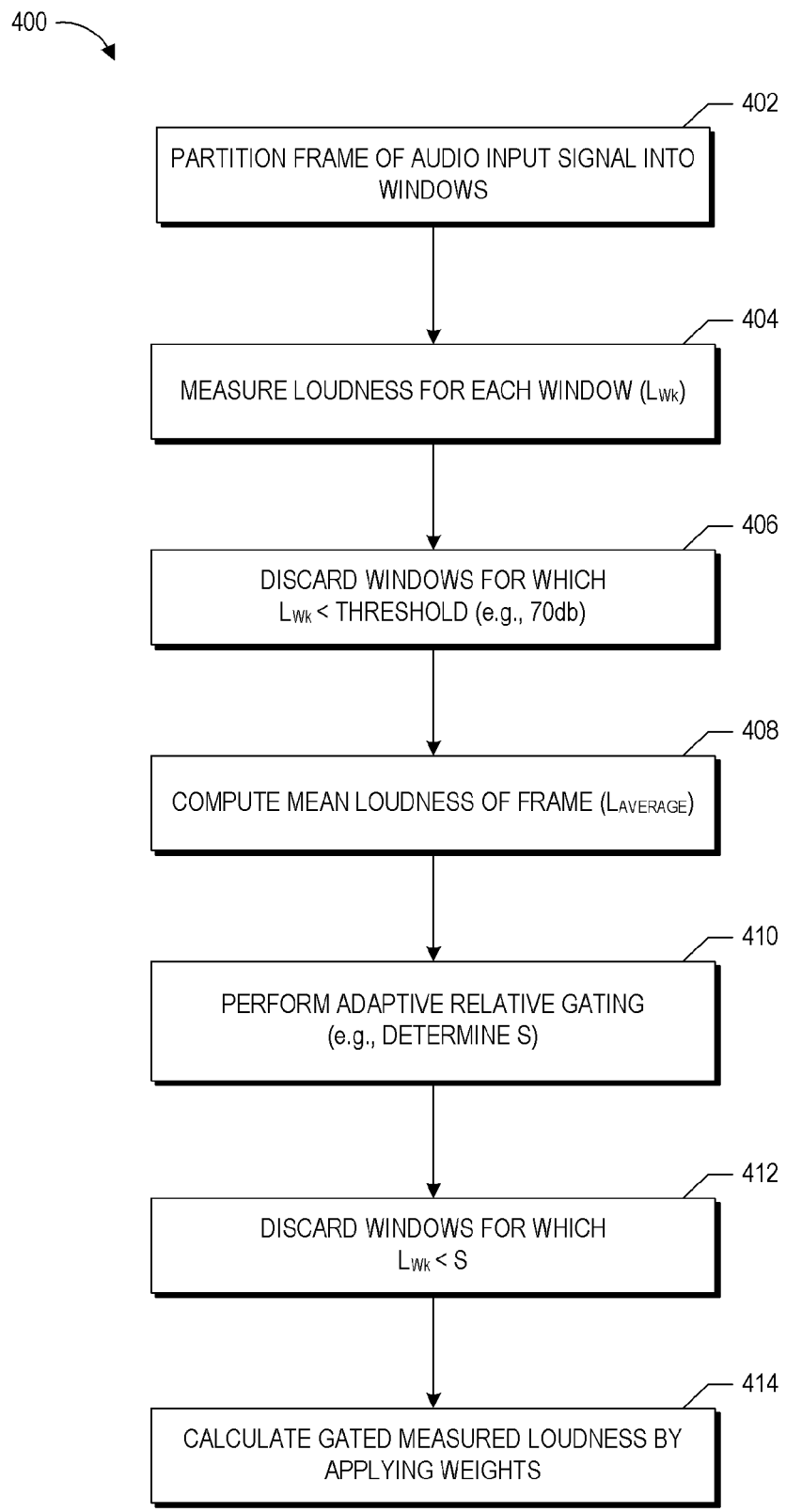
FIG. 4A illustrates an embodiment of a process for determining loudness of audio signals in real time.

The adaptive or dynamic gating module 360 of FIG. 3A performs adaptive or dynamic gating of initial measured loudness 345. In certain embodiments, adaptive gating 360 employs a two-stage process. FIG. 4A illustrates a process 400 for determining loudness in real time which can be performed by the adaptive gating module 360. With reference to FIG. 4A, a frame of the audio input signal 210 is partitioned or divided into windows in block 402. In block 404, the process 400 measures or calculates the instantaneous loudness $L_{W_k}$ for each window in a frame. In one embodiment, this calculation can be performed utilizing equation (2) and/or equation (4). In an embodiment using 400 msec windows that overlap by 75% are used, a new loudness value $L_{W_k}$ may be computed every 100 msec. A first stage of adaptive gating 360 is performed in block 406, where loudness of each window is compared to a loudness threshold. The loudness threshold can be selected to reflect to discard loudness values that are likely to be periods of silence and/or low-level noise. In one embodiment, the loudness threshold can be selected as −70 dB (or −70 LKFS) or approximately −70 dB. In other embodiments, different values of the loudness threshold may be used, such as −80 dB or smaller, −65 dB or smaller or larger, and so on. This first stage of adaptive gating 360 can be referred to as absolute thresholding because the loudness threshold may be the same for most or all windows.

In block 406, the process 400 discards (e.g., excludes from further processing) windows for which loudness falls below the loudness threshold. This discarding can be performed because such windows may contain audio information that cannot be discerned by a listener, and such audio periods should not be taken into account when computing loudness of the audio input signal 210. In block 408, the process 400 determines mean loudness of the frame of the audio input signal 210. In one embodiment, the process 400 utilizes the following equation or the like for determining the mean loudness:

$$\overline{L} = \frac{1}{M} \sum_{k=0}^{M-1} L_{W_k} \qquad (5)$$

where M is the number of overlapping windows in the frame and $L_{W_k}$ is the measured loudness of a kth window.

In certain embodiments, a second stage of adaptive gating 360 involves performing an adaptive or dynamic relative gating operation (which can be signal dependent). Advantageously, adaptive relative gating can account at least in part for transient events, which can reflect sudden, large changes in the loudness of the audio input signal 210. For example, in the audio signal, a loud portion (e.g., explosion) or vice versa may be immediately followed by a relatively quiet portion (e.g., whisper). As another example, a commercial may be inserted into an audio stream, and the commercial may have relative loudness that is larger than that of the content of the audio stream. It is desirable for the audio processing system 200A and/or 200B to track such transient events (e.g., high loudness to low loudness transitions) and take the differences in loudness caused by such events into account when adjusting loudness of the audio input signal. One reason is that doing so can provide greater transparency and preserve the dynamic range of the signal.

Another reason for using adaptive relating gating is that during real time processing of the audio signal, the audio processing system 200A and/or 200B may not have access to the entire audio program (e.g., entire television program, entire commercial, etc.). Instead, processing is performed on segments of the audio stream, and such segments may include audio content with different loudness values, such as part of a television program and part of a commercial. If the entire audio stream were available, determining loudness of such combined or aggregated content using static loudness correction techniques (e.g., file-based adjustment) could be performed separately for each different component. For example, as is described in ITU BS.1770-2, gated loudness $L_{KG}$ can be determined by using a threshold obtained from subtracting a constant (e.g., 10 LKFS) from loudness measurements that are above an absolute threshold (e.g., −70 LKFS). However, when such static correction techniques are applied in real time, inaccurate loudness values may be determined. Basing loudness correction on such inaccurate values could adversely affect the loudness correction of the audio input signal 210.

Yet another reason for using adaptive relative gating can be maintenance of suitable responsiveness of the audio processing system 200A and/or 200B. While it may be generally desirable to perform loudness adjustment so that periods of silence do not substantially impact the adjustment, it can be advantageous for the audio processing system to quickly react to changes in the loudness (e.g., transitions from high loudness to low loudness) and adjust the loudness accordingly. For example, when beginning of a relatively quiet portion is played immediately after a loud commercial, the audio processing system 200A and/or 200B can advantageously recognize the abrupt change in loudness and quickly react by adjusting (e.g., increasing) the loudness of the audio input signal 210.

The process 400 performs adaptive gating 360 in blocks 410 and 412. In block 410 in one embodiment, the process can dynamically determine a deviation of the mean loudness of a current frame (e.g., computed in block 408) from the last determined gated measured loudness 365. A large deviation may indicate an onset of a transient event, which the process 400 may need to quickly react to. The deviation can be determined by using the following equations or the like:

$$S = \overline{L} - C_1 - \Delta \quad (6)$$

$$\Delta = \sum (L_{Wk} - L_{GMR})$$

where $L_{Wk}$ is the loudness of windows in frames (as is measured in block 404), $\overline{L}$ is the mean loudness value of the current frame, $C_1$ is a constant (e.g., 10 dB or another suitable value), and $\Delta$ is an accumulated difference between the instantaneous loudness value (e.g., calculated in block 404) and previously determined gated measured loudness $L_{GMR}$ (e.g., determined for an immediately preceding frame). In some embodiments, the accumulated difference $\Delta$ can be bounded by lower bound and/or upper bound. For example, the lower bound can be 0 (thereby setting the upper range of adaptive gating to the constant $C_1$) or another suitable value smaller or greater than 0 (e.g., −10, −5, −1, 1, 2, 5, 10, etc.) As another example, the upper bound can be −40 dB or another suitable value smaller or greater than −40 dB (e.g., −20 dB, −25 dB, −30 dB, −35 dB, −45 dB, −50 dB, −55 dB, etc.). Thus, in one embodiment, the difference between the loudness output and the adaptive relative gate can range from about −10 dB (e.g., per the BS 1770-2 specification) to about −40 dB (unlike the BS 1770-2 specification). Other ranges are also possible. In certain embodiments, the deviation can be determined by using the following equations or the like:

$$S = \overline{L} - C_1 - \Delta \quad (7)$$

$$\Delta = \sum (\overline{L} - L_{GMR})$$

where $\overline{L}$ is the mean loudness value of the current frame, $C_1$ is a constant (e.g., 10 dB or another suitable value), and $\Delta$ an accumulated difference between the mean loudness value and previously determined gated measured loudness $L_{GMR}$ (e.g., determined for an immediately preceding frame). Deviation $\Delta$ of equation (7) can be bounded as is described above. In one embodiment, deviation $\Delta$ of equations (6) and/or (7) can represent the difference between the instantaneous loudness or mean loudness value respectively and previously determined gated measured loudness 365, without accumulating the difference. At initialization, the previously determined gated measured loudness 365 can be set to a suitable initial value, such as the mean loudness (e.g., computed in block 408).

In some embodiments, deviation $\Delta$ can be an accumulated difference between the instantaneous loudness $L_{Wk}$ (e.g., determined in block 404) and mean loudness value of the current frame (or preceding frame, such as immediately preceding frame) $\overline{L}$. Deviation $\Delta$ can be bounded as is described above. In one embodiment, deviation $\Delta$ can represent the difference without accumulation.

In block 412, the process 400 discards from calculation windows of a frame for which loudness (e.g., calculated in block 404) is below the adaptive relative gating loudness of the frame determined in block 410. Such windows may contain audio information that cannot be discerned by a listener (e.g., periods of silence and/or noise), and such audio periods should not be taken into account when computing loudness of the audio input signal 210.

In some embodiments, the second stage of adaptive gating 360 is not performed. Instead, loudness values that have not been discarded in block 406 are utilized for computing the weighted average in block 414. In certain embodiments, the first and second stages of adaptive gating 360 are not performed. Instead, loudness values measured for each window in block 404 are utilized in computing the weighted average in block 414.

Weighting Loudness Values

Figure 4C:
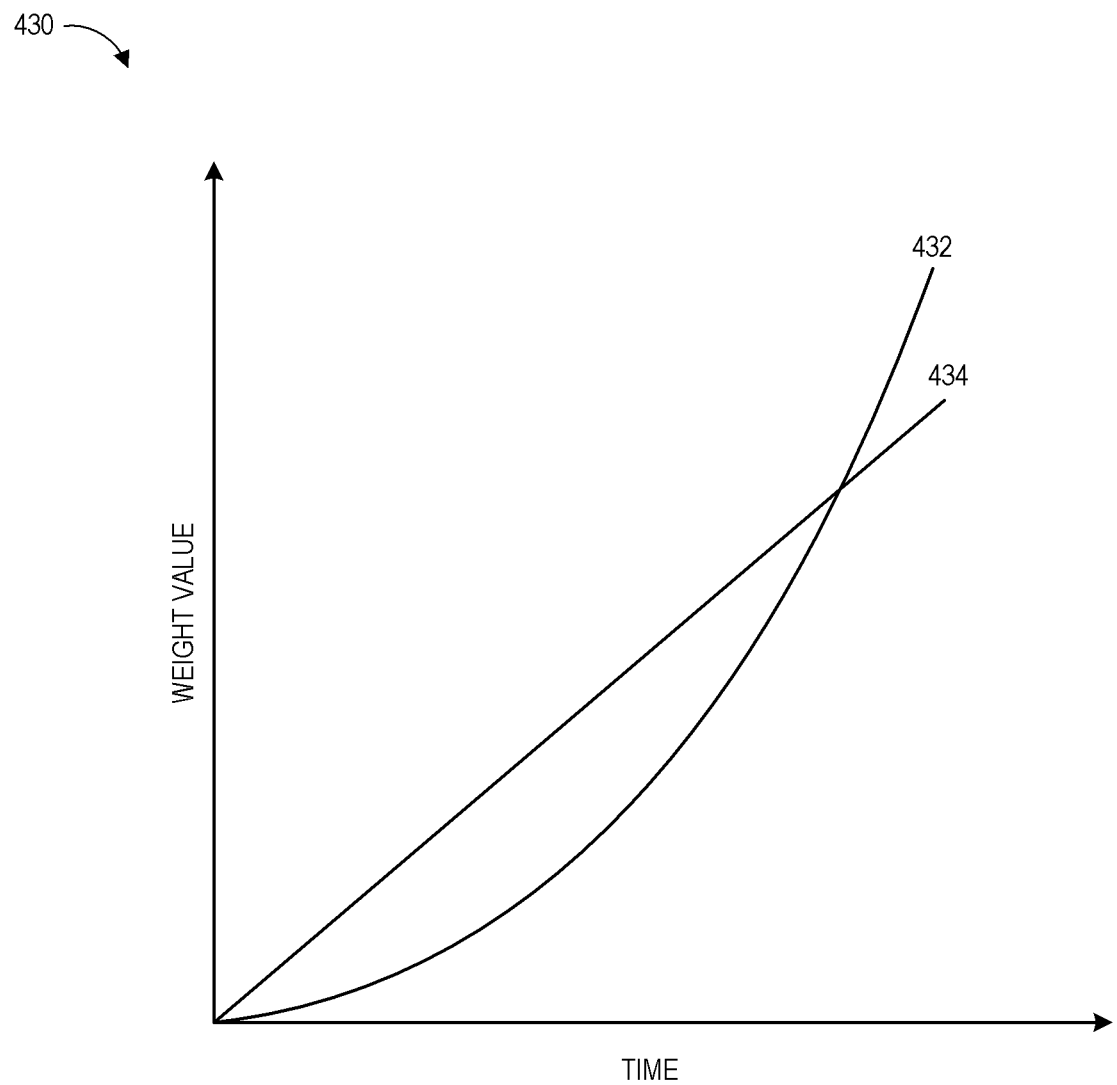
FIG. 4C illustrates a chart showing example of weighting audio signals.

In block 414, the process 400 determines gated measured loudness 365 of the frame (or a window, part of a window, etc.). In some embodiments, the process 400 computes a weighted average of loudness values for windows that were not excluded from calculation in blocks 406 or 412. In one embodiment, the process 400 performs temporal weighting (e.g., weighting based on recency of the samples within a window and/or windows). Temporal weighting may be performed in cases when windows of the audio signal are overlapped, as is described above and illustrated in FIG. 4B. Various types of weighting can be utilized. FIG. 4C shows a chart 430 with two exemplary weighting schemes 432 and 434. As is illustrated, the weighting scheme 432 is non-linear and assigns progressively greater weights (computed non-linearly) to more recent samples and/or windows. The weighting scheme 432 can, for example, utilize the following equation or the like for computing the weights:

$$W_{Tk} = \alpha^k \quad (8)$$

where $\alpha$ is a constant and k is a sample index (within a window) and/or window index. The value of $\alpha$ can be selected so that a suitable emphasis is placed on more recent samples and/or windows. In one embodiment, $\alpha$ can be selected as a value greater than 1 (which can emphasize more recent samples and/or windows in relation to less recent samples and/or windows). In another embodiment, $\alpha$ can be selected as a number less than 1 (which can deemphasize more recent samples and/or windows in relation to less recent samples and/or windows).

As is illustrated, the weighting scheme 434 is linear, and assigns progressively greater weights (computed linearly) to more recent samples and/or windows. The weighting scheme 434 can, for example, utilize the following equation or the like for computing the weights:

$$W_{Tk} = C_2 k + C_3 \quad (9)$$

where $C_2$ and $C_3$ are constants and k is a sample (within a window) and/or window index. In one embodiment, the slope of the line 434 can be varied (e.g., by selecting a suitable value of $C_2$) in order to place a suitable emphasis on more recent samples and/or windows. A combination of linear and non-linear weights can be used in some embodiments.

In certain embodiments, the process 400 performs the weighting based on deviation of a loudness value (e.g., computed in block 404) from the mean loudness value of the frame (e.g., computed in block 408). This may be advantageous for quickly reacting to transient events. For example, the process 400 can utilize the following equation or the like for computing the weights:

$$W_{Mk} = \beta^{|L_k - \overline{L}|} \quad (10)$$

where β is a constant, $L_k$ is measured loudness of a kth window (and/or sample within a window), and $\overline{L}$ is the (non-weighted) mean loudness of the frame. In one embodiment, β can be selected as a value greater than 1 (which can emphasize more recent windows and/or samples in relation to less recent windows and/or samples). In another embodiment, β can be selected as a number less than 1 (which can deemphasize more recent windows and/or samples in relation to less recent windows and/or samples). When there is no deviation from the mean loudness, the value of a weight computed according to equation (10) is 1. However, the value of the computed weight increases as there is greater deviation from the mean loudness value. Such windows (or samples) may likely correspond to transient events, and are thus emphasized by equation (10) in the calculation of the gated measured loudness 365.

In some embodiments, the values of α of equation (8) and/or β of equation (10) can be adjusted based on the statistics of the audio input signal 210. Statistics, for example, can be reflected by the variation (e.g., as measured by the standard deviation or a coefficient of variation) in loudness of the audio input signal 210. Variation of loudness of the audio input signal 210 can be measured using the determined loudness of windows in the frame (e.g., measured in block 404). For example, the following formula for the standard deviation or the like can be utilized for estimating the variation:

$$\sigma_L = \sqrt{\frac{1}{M} \sum_{k=0}^{M-1} (L_{Wk} - \overline{L})} \quad (11)$$

where M is the number of overlapping windows in a frame, $L_{Wk}$ is loudness of a window, and $\overline{L}$ is the mean loudness of the frame (e.g., computed in block 408).

In some embodiments, if a portion of the signal is determined to have relatively constant or static loudness (e.g., variation of loudness of the frame is determined to be below a threshold) the values of α and/or β can be decreased to lower or dampen the sensitivity of the loudness adjustment and thereby attain a slower reaction to the changes in the loudness. On the other hand, if the portion of the signal is determined to have relatively dynamic loudness (e.g., variation of loudness of the frame is determined to be above the threshold), the values of α and/or β can be increased to increase the sensitivity of the loudness adjustment and thereby attain faster reaction to changes in the loudness.

In some embodiments, the values of α and/or β can be varied from a default value of about 5000 (to provide quick reaction to dynamic changes) to about 217, (to provide a more static adjustment). In other embodiments, other suitable upper and lower bounds can be used. For example, if the values of α and β were set to 1, then the weighted average of the loudness values would be an arithmetic mean. The values of α and β may also be lower than 1, in some embodiments. In certain embodiments, different upper and/or lower bounds can be used for the values α and β. In some embodiments, the values of α and β can be varied in a different manner (e.g., with different rates of decrease and/or increase). In some embodiments, the values of α and/or β are reset to the default value(s) (e.g., 5000) when variation of the loudness of the frame is determined to be above the threshold. Advantageously, such resetting may ensure or attempt to ensure that transient events are accounted for by the audio processing system.

Decreasing the values of α and/or β can result in the audio processing system 200A and/or 200B performing analysis that mimics using static loudness correction techniques or that otherwise applies less aggressive loudness leveling. This may be feasible for audio input signal 210 portions that have substantially constant loudness, such as certain portions of music. Decreasing the values of α and/or β can preserve transparency of the audio input signal 210 in such cases.

Figure 5:
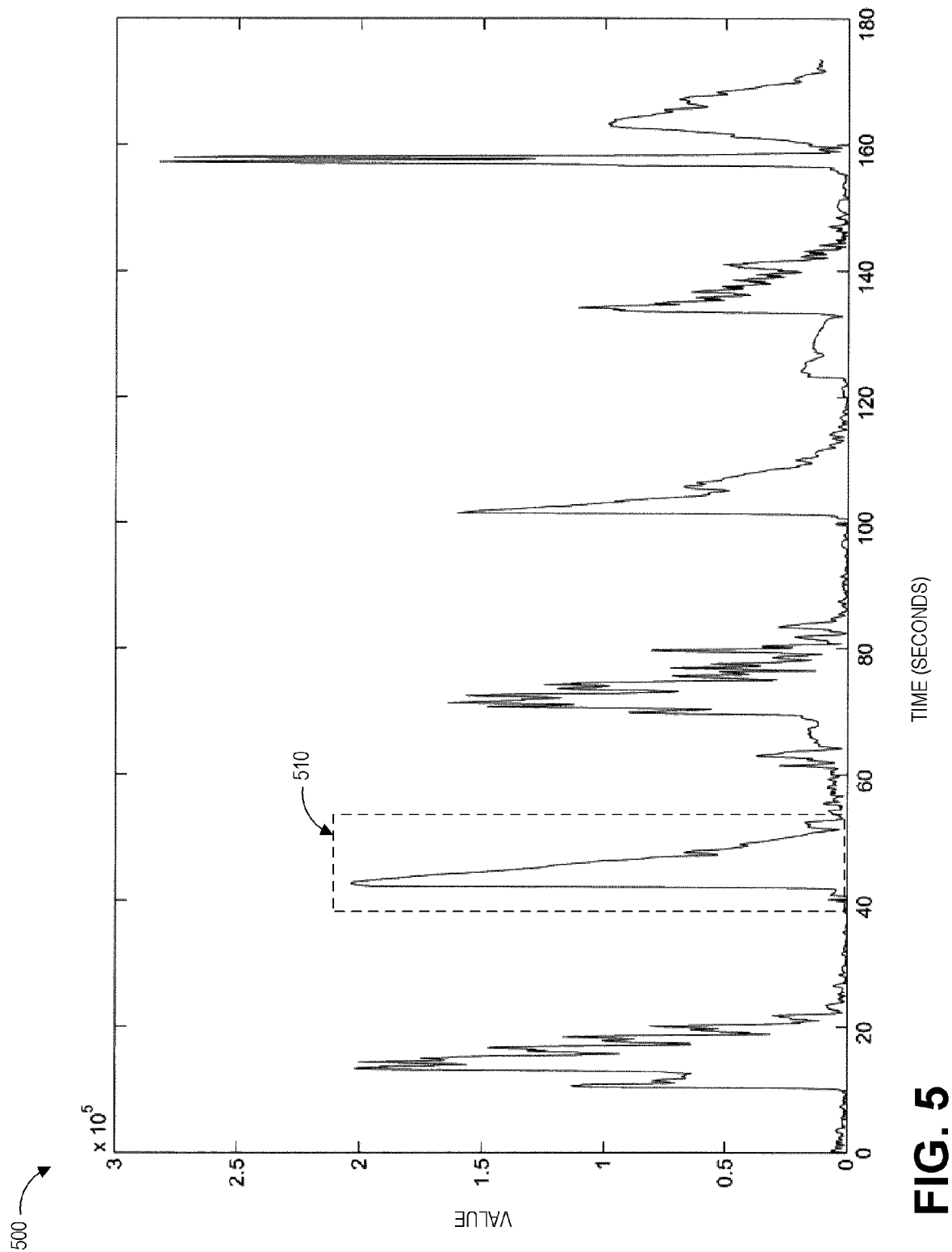
FIG. 5 illustrates a chart showing an example weighting of audio signals.

FIG. 5 illustrates a chart 500 showing an example weighting of audio signals according to an embodiment. The x-axis reflects time in seconds, and the y-axis reflects values of the weights (e.g., $W_{Mk}$). Region 510 (which corresponds in part to region 610 of FIG. 6) illustrates weights that may be derived for a transient event, such as a sudden, rapid decrease in loudness of the audio input signal 210. As is illustrated in chart 500, values of the weights are accordingly increased to account for the transient event.

With reference to FIG. 4, in some embodiments, the process 400 utilizes both weighting schemes described above and reflected in equations (9) and (10).

Figure 6:
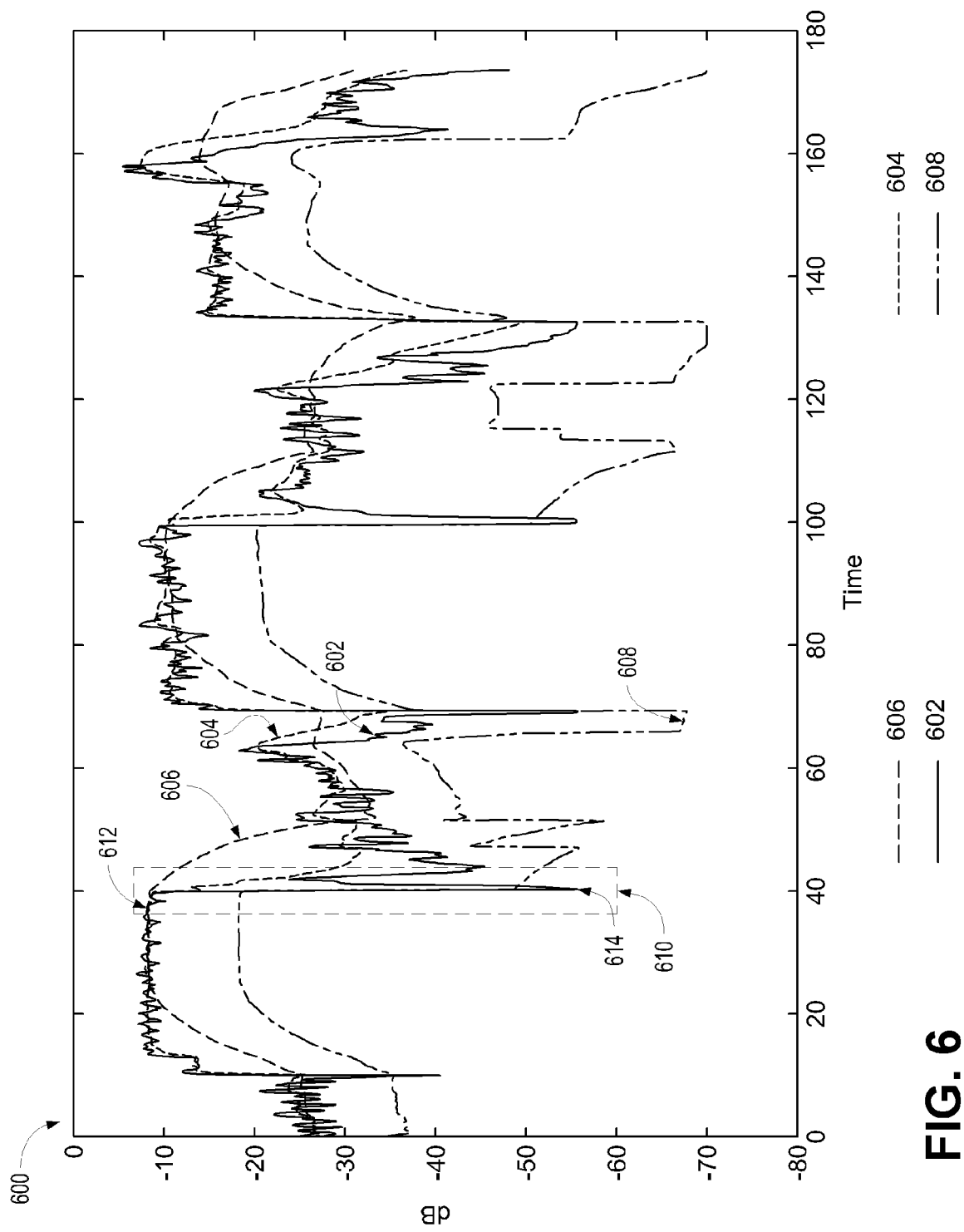
FIG. 6 illustrates a chart showing an example determination of loudness of audio signals in real time.

FIG. 6 illustrates a chart 600 showing determination of loudness of audio signals in real time according to an embodiment. The x-axis reflects time in seconds, and the y-axis reflects loudness intensity in decibels. The chart 600 depicts processing of numerous frames (e.g., having duration of 12 seconds) of the audio input signal 210. The curve 602 represents instantaneous loudness $L_{Wk}$ of windows in frames (as is measured in block 404). The curve 604 represents gated measured loudness of the frames (as is measured in block 414). The curve 606 represents mean loudness $\overline{L}$ of frames (as measured in block 408). The curve 608 represents the adaptive relative gating function (as determined in block 410).

As is shown in FIG. 6, the curve 604 (which reflects gated measured loudness of the frames) can closely track the actual loudness of the audio input signal 210, which is reflected by the curve 602. In contrast, the curve 606 (which may, in one embodiment, reflect existing loudness correction techniques), does not track the actual loudness of the audio input signal 210 as closely in regions where the actual loudness undergoes rapid changes. As is shown in region 610, for example, the curve 606 deviates from the actual loudness by a significantly large amount, while the curve 604 more closely tracks the actual loudness in this example.

In some embodiments, the curve 604 closely tracks the actual loudness of the audio input signal 210 because the curve 608 (which reflects the adaptive relative gating function determined in block 410) accounts for rapid changes in the actual loudness. This is illustrated, for example, in region 610 which captures a transient event, such as a sudden, rapid decrease in loudness of the audio input signal 210. The transient event is reflected by the curve 602 decreasing from loudness above −10 dB at point 612 to loudness below −50 dB at point 614. This drop in loudness occurs over a short period of time, and may indicate beginning of a quiet portion of a television program. As is shown in the example scenario of FIG. 6, loudness increases following the drop in point 614, which may indicate the end of the transient event. Because the adaptive relative gating function represented by the curve 608 is generally below the curve 602, the transient event is accounted for by the process 400. However, existing loudness determination techniques, which gate based on subtracting a constant (e.g., −10 dB) from the curve 606, would likely miss this transient event. In other words, such static loudness determination techniques (e.g., file-based adjustment) would likely discard this transient event from the loudness calculation. Hence, the transparency of loudness-adjusted audio input signal 210 would be adversely affected.

Adaptive Frame Length

In some embodiments, frame duration or length can be varied by the audio processing system 200A and/or 200B (e.g., instead of adjusting the values of α of equation (8) and β of equation (10)). For instance, duration of the frame can be adjusted based on the variation (e.g., as measured by the standard deviation or a coefficient of variation) in loudness of the audio input signal 210. Variation of loudness of the audio input signal 210 can be measured using determined loudness of windows in the frame (e.g., measured in block 404). For example, equation (11) can be be utilized for estimating the variation.

In some embodiments, if the variation of loudness of the frame is determined to be below a threshold, the length of the frame is increased. In other words, relatively small variations of loudness may reflect that loudness of the portion of the audio input signal 210 covered by the frame is relatively static. A limit on the length of the frame can be set, such as 48 seconds or another suitable value.

Increasing the frame duration (or widening the frame) may improve processing performance and save storage space. In addition, increasing the frame duration results in the audio processing system 200A and/or 200B performing analysis that mimics using static loudness correction techniques. In other words, loudness adjustment applies a substantially static loudness correction when the frame is widened. This may be possible for audio input signal 210 portions that have substantially constant loudness, such as certain portions of music. Widening the frame can preserve transparency of the audio input signal 210 in such cases.

In certain embodiments, when variation of loudness of the frame is determined to be above the threshold, the length of the frame is decreased. The rate of decrease of frame length (e.g., decrease step size) may be different than the rate of increase of frame length (e.g., increase step size). For example, the decrease step size may be larger than the increase step size, such as 50 times greater or another suitable value. In some embodiments, the frame length is reset to the initial frame length (e.g., 12 seconds) when variation of loudness of the frame is determined to be above the loudness threshold. Advantageously, such resetting may ensure or attempt to ensure that transient events are accounted for by the audio processing system.

Perceptual Information Content Estimation

With reference to FIG. 2B, the perceptual information content estimation module 225 can determine or estimate the amount of perceptual information contained in a portion of the audio input signal 210 (e.g., a frame, a window, partial frame, partial window, a plurality of frames, a plurality of windows, etc.). The perceptual information content estimation module 225 can estimate an information content of the portion of the audio input signal 210. Based on the estimated information content, the perceptual information content estimation module 225 can determine weighting associated with adjusting the loudness of the portion of the audio input signal 210, such $W_{Pk}$ used in equation (12) described below. In one embodiment, the audio processing system 200B and/or 200A may not process the portion if its informational content is determined to be below an information content threshold. Advantageously, estimating informational content can improve system performance in some embodiments.

For example, the portion of the audio input signal 210 (e.g., frame) may contain noise, such as random noise, background noise, or the like, and the perceptual information content estimation module 225 may determine that little or no information content is contained in the portion of the audio input signal 210. In such case, the audio processing system 200B and/or 200A may perform little or no loudness adjustment (e.g., set $W_{Pk}$ to zero for the window or entire frame) on the portion as it is unlikely to be perceived by the listener. As another example, the perceptual information content estimation module 225 may determine that a portion of the audio input signal 210 contains a substantial amount of information (e.g., the portion may be music or speech). In such case, the weighting may be set so that the portion is suitably emphasized for the purposes of loudness adjustment (e.g., set $W_{Pk}$ to a large value for the window or entire frame). For instance, weighting can be proportional to the difference between determined information content and the information content threshold. For example, audio signal portions with higher information content can be assigned greater weights.

Figure 7A:
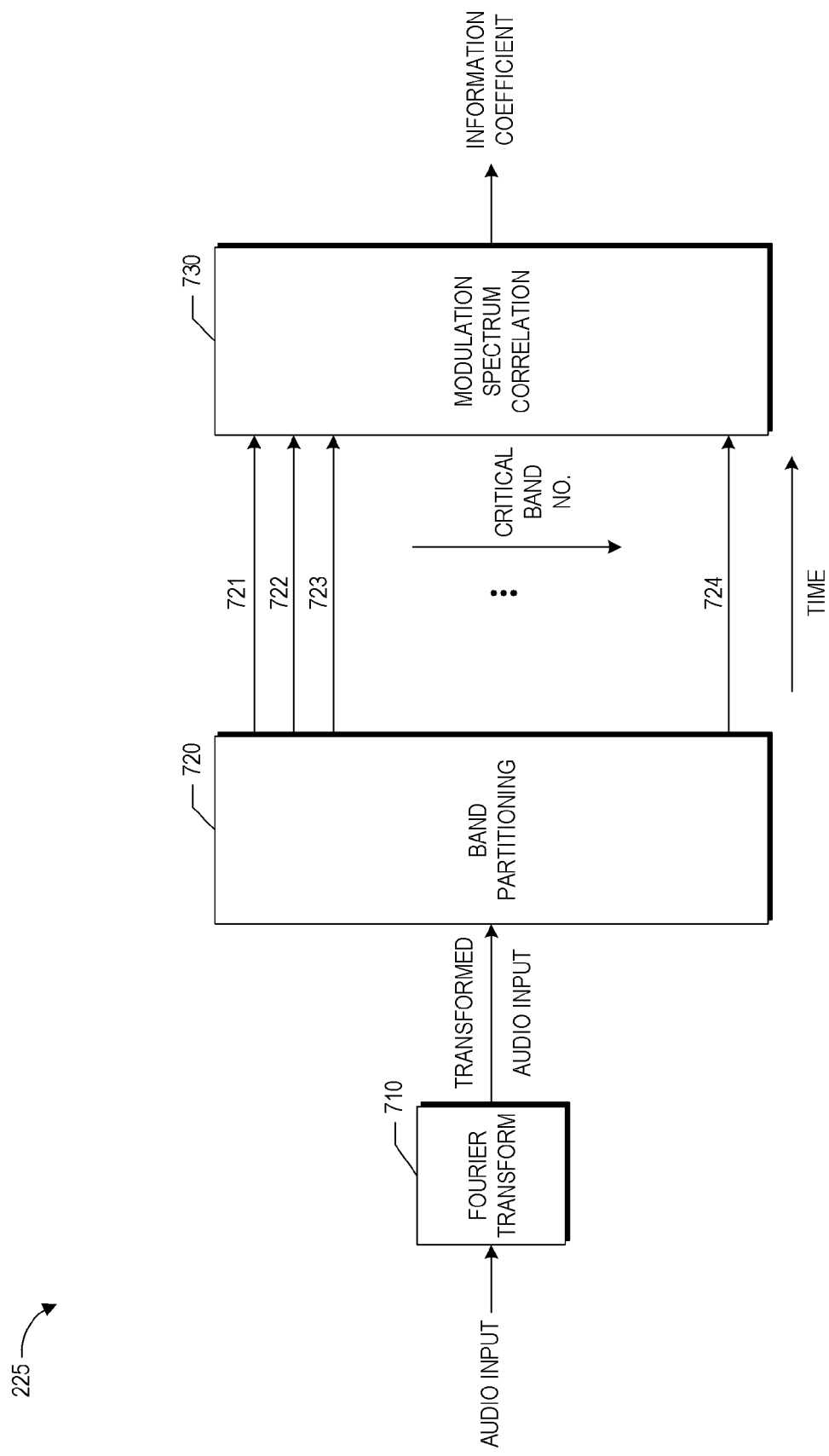
FIG. 7A illustrates an embodiment of a system for determining information content of audio signals in real time.
Figure 7B:
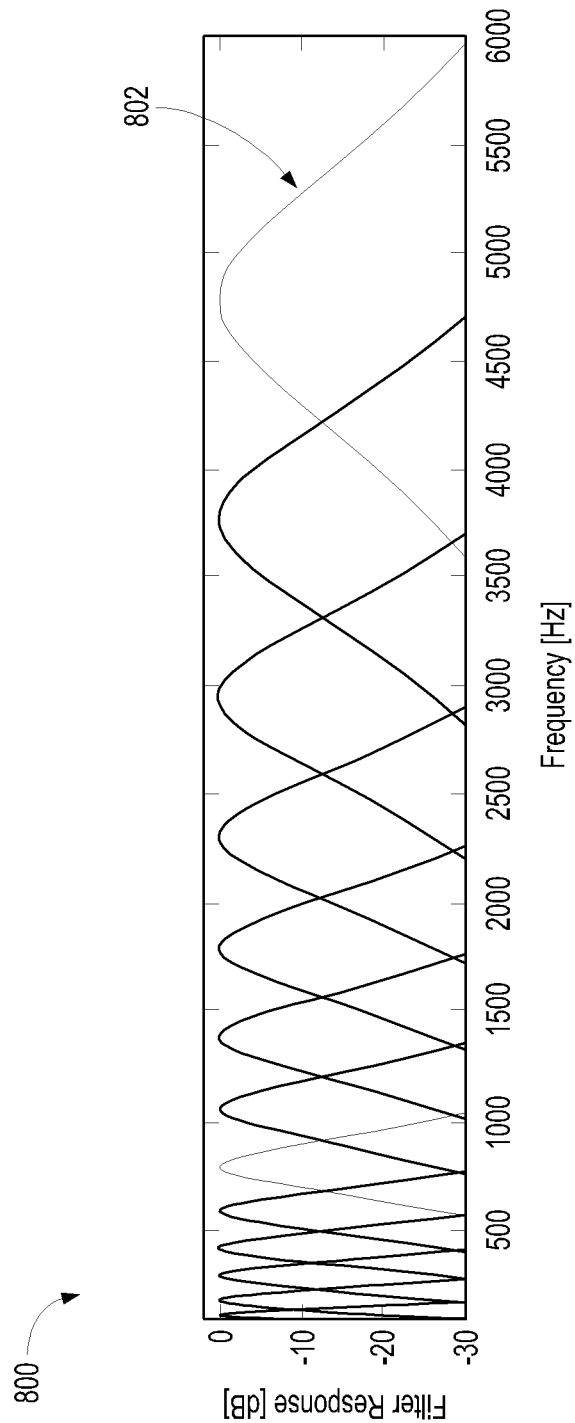
FIG. 7B illustrates an example frequency response of a bank of auditory filters similar to the filters used by the human ear.

FIG. 7A illustrates an embodiment of perceptual information content estimation module 225. A Fourier transform module 710 transforms a portion of the audio input signal 210 to the frequency domain. For example, the Fourier transform module 710 can perform a fast Fourier transform (FFT) of the portion of the audio input signal 210. Any suitable duration of the portion of the audio input signal 210 can be used, such as 100 msec, 150 msec, 200 msec, etc. Frequency transformed audio input portion is subjected to band partitioning by the module 720. In one embodiment, band partitioning module 720 performs critical band partitioning of transformed audio input by utilizing a bank of filters that mimics the auditory response of a human ear. For example, the band partitioning module 720 can use overlapping, non-linearly spaced bandpass filter, such as logarithmically-spaced bandpass filters. An example of such filter bank 800 is illustrated in FIG. 7B, which illustrates a bank of overlapping, non-linearly spaced band-pass filters 802. As is shown in FIG. 7B, the center frequencies of band-pass filters are spaced non-linearly, and this spacing increases as frequency increases. Other suitable filter banks can be used, such as the gammatone approximation filters described in U.S. Patent Publication No. 2009/0161883, titled "SYSTEM FOR ADJUSTING PERCEIVED LOUDNESS OF AUDIO SIGNALS," filed on Dec. 19, 2008, which is hereby incorporated by reference herein in its entirety.

With reference to FIG. 7A, the band partitioning module 720 outputs critical bands information (e.g., magnitude) 721, 722, 723, and 724 of the portion of the audio input signal 210. Critical bands can be band-pass filtered components of frequency-transformed portion of the audio input signal 210. Critical bands 721 through 724 are depicted in increasing order (e.g., critical band 724 has higher order or covers a greater bandwidth than critical band 721), and information contained in the critical bands can be ordered based on time (e.g., second sample in critical band 721 may correspond to audio signal sample that follows the first sample). A suitable number of critical bands can be used by the band partitioning module 720, such as between 20 and 25 bands, between 15 and 30 bands, or some other suitable number of bands. The frequency range covered by the band partitioning module 720 can be, for example, between 20 Hz and 20 kHz or some subset thereof covering at least a portion of the audible range of the human auditory system.

Critical band information is input to a modulation spectrum correlation module 730, which performs correlation of critical band information. In one embodiment, the modulation spectrum correlation module 730 computes cross-correlation for some or all critical bands (e.g., each critical band) against some or all other critical bands. For example, when 25 critical bands are used, the modulation spectrum correlation module 730 can compute 25×25 (or 625) cross-correlation values. In another embodiment, the modulation spectrum correlation module 730 can compute different number of cross-correlation values, such as not compute the autocorrelation for each critical band (e.g., compute 600 cross-correlation values in case when 25 critical bands are used). The modulation spectrum correlation module 730 can analyze cross-correlation values for similarity. In one embodiment, a substantially large degree of similarity may indicate that the portion of the auditory input signal 210 has at least some, and potentially high, information content. For example, if a portion of the auditory input signal 210 is determined to have substantially large degree of similarity, the portion may have information in some or all frequency bands covered by band partitioning module 720. This may indicate that the portion of the signal carries audible information (e.g., music, speech, etc.). On the other hand, a substantially small or low degree of similarity may indicate that the portion of the auditory input signal 210 has low information content. For example, if a portion of the auditory input signal 210 is determined to have substantially small degree of similarity, it may indicate that the portion is noise (e.g., random noise, such as white noise, which tends to have a constant spectral density).

Based on correlation analysis, the modulation spectrum correlation module 730 can determine the information content of the portion of the audio input signal 210. In one embodiment, the modulation spectrum correlation module 730 can apply a non-linear function to determined correlations in order to determine or compute an information coefficient (e.g., weighting value). In another embodiment, a linear function can be utilized. The information coefficient is preferably a measure of information content (e.g., a value between 0 and 1). In another embodiment, the information coefficient may be a binary value that indicates presence or absence of information content (e.g., 0 may indicate little or no information content, and 1 may indicate presence of information content).

In one embodiment, the information coefficient can correspond to an information content weighting $W_{Pk}$. With reference to FIG. 4A, the process 400 can utilize weighting $W_{Pk}$ determined by a perceptual information content estimation block 225, as is explained below. With reference to FIG. 3A, gated measured loudness 365 of a frame can be determined by process 400 in block 414 using the following equation or the like (assuming that the weights are normalized to 1):

$$L_{GMR} = \frac{\sum_{i=0}^{N-1} L_{Wi} \cdot \alpha^i \cdot \beta^{|L_i - \overline{L}_i|} \cdot W_{Pi}}{\sum_{i=0}^{N-1} \alpha^i \cdot \beta^{|L_i - \overline{L}_i|} \cdot W_{Pi}} \qquad (12)$$

where, N is the number of windows or blocks in a frame, a is a coefficient of temporal weighting (described above), β is a coefficient based on the deviation of the loudness value (described above), $W_{Pi}$ is weighting based on perceptual content, $L_i$ represents loudness for ith window or block (e.g., $L_{Wi}$ as computed in block 404), and $\overline{L}_i$ represents mean loudness of the frame (e.g., as computed in block 408). In an embodiment that utilizes 400 msec windows that overlap by 75%, a new loudness value can be computed every 100 msec. In certain embodiments, N can represent number of overlapping windows in frame (e.g., 4 windows), number of window overlaps (e.g., 4 for each window when 400 msec windows overlap by 75%), and so on. In some embodiments, index k (as is used in some equations described above) can be used in place of index i. In various embodiments, $\overline{L}_i$ can correspond to mean loudness of a window.

Additional Embodiments

Although described herein primarily with respect to television broadcasting, the features of the systems and methods described herein can be implemented in other broadcasting and streaming scenarios. For instance, the systems and methods can be used to adjust the loudness of audio signals in radio broadcasts, which often have programming interspersed with commercials. In addition, the systems and methods described herein can be used to adjust the loudness of audio signals streamed or broadcast over a network, such as the Internet.

Although described herein primarily with respect to real-time processing, the features of the systems and methods described herein can used in file-based processing. For instance, the systems and methods can be used to adjust the loudness of an entire audio file or audio program at once. As another example, the systems and methods can be used to adjust the loudness during VOD processing, AVOD processing, or the like.

Although described herein primarily with respect to performing the loudness adjustment directly using loudness values, systems and methods described herein can be used to perform loudness adjustment in different domains. For instance, instead of directly weighting the computed initial loudness values, gain values can be determined (e.g., based on the loudness values, such as computing the multiplicative inverse of the loudness values) and weighted in a weighted average using any of the weighting techniques described above.

Conclusion

Depending on the embodiment, certain acts, events, or functions of any of the algorithms described herein can be performed in a different sequence, may be added, merged, or left out all together (e.g., not all described acts or events are necessary for the practice of the algorithm). Moreover, in certain embodiments, acts or events may be performed concurrently, e.g., through multi-threaded processing, interrupt processing, or multiple processors or processor cores, rather than sequentially.

The various illustrative logical blocks, modules, and algorithm steps described in connection with the embodiments disclosed herein may be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the disclosure.

The various illustrative logical blocks and modules described in connection with the embodiments disclosed herein may be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be a processor, controller, microcontroller, or state machine, combinations of the same, or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium can be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated may be made without departing from the spirit of the disclosure. As will be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A method of adjusting loudness of an audio signal, the method comprising:
   receiving an audio signal;
   dividing the audio signal into a plurality of frames;
   for a current frame of the plurality of frames, by one or more processors:
      measuring initial loudness values for blocks of samples in the current frame to determine a plurality of initial loudness values,
      comparing the plurality of initial loudness values to a loudness threshold and selectively discarding at least some of the initial loudness values that do not satisfy the loudness threshold to avoid or reduce subsequent loudness adjustment of first portions of the audio signal containing silence or noise instead of information,
      computing an adjusted adaptive loudness threshold based at least partly on a deviation between a representation of the initial loudness values that have not been discarded and a representation of a previous adaptive loudness threshold computed for a previous frame, the adjusted adaptive loudness threshold computed for the current frame being different from the previous adaptive loudness threshold computed for the previous frame, wherein the adaptive loudness threshold is responsive to transient loudness spikes in the audio signal so that the subsequent loudness adjustment compensates for the transient loudness spikes more than a mean loudness smoothing would compensate for the transient loudness spikes, and
      in response to comparing initial loudness values that have not been discarded to the adjusted adaptive loudness threshold, selectively discarding at least some of the initial loudness values that do not satisfy the adjusted adaptive loudness threshold, wherein selectively discarding the at least some of the initial loudness values includes discarding at least one block of samples corresponding to the at least some of the initial loudness values, and wherein the at least one discarded block of samples is excluded from further processing;
   adjusting loudness of the audio signal based at least partly on the initial loudness values that have not been discarded, wherein said adjusting comprises applying larger adjustment to second portions of the audio signal due to the transient loudness spikes than to third portions of the audio signal having lower amplitude loudness changes than the transient loudness spikes, and wherein said adjusting comprises applying reduced or no adjustment to the first portions of the audio signal containing silence or noise; and
   providing the adjusted audio signal for playback.

2. The method of claim 1, further comprising computing the adjusted adaptive loudness threshold based at least in part on a loudness value of the previous frame.

3. The method of claim 2, wherein said computing the adjusted adaptive loudness threshold comprises computing a difference between the previous loudness value and at least one of a mean loudness value of the current frame and an initial loudness value.

4. The method of claim 3, wherein said computing the difference comprises accumulating the difference.

5. The method of claim 4, wherein the difference is bounded by a lower bound and an upper bound.

6. The method of claim 1, further comprising computing the adjusted adaptive loudness threshold based at least in part on a difference between an initial loudness value and the mean loudness value of the current frame.

7. The method of claim 1, further comprising computing a weighted average of at least some of the initial loudness values to produce an adjusted loudness value, wherein said adjusting the loudness of the audio signal comprises adjusting based at least partly on the adjusted loudness value.

8. The method of claim 7, wherein weights in the weighted average are computed based at least partly on one or both of recency of the initial loudness values and variation of the initial loudness values.

9. The method of claim 8, wherein the weights are further computed based at least partly on a modulation spectrum domain analysis of the audio signal, wherein the modulation spectrum domain analysis comprises computing a coefficient of variation among time-frequency representations of the audio signal.

10. A system for adjusting loudness of an audio signal, the system comprising:
 a loudness analysis module comprising one or more processors, the loudness analysis module configured to:
  access a current frame of an audio signal, the frame comprising a plurality of samples of the audio signal,
  measure initial loudness values for blocks of the samples in the current frame to calculate a plurality of initial loudness values,
  compare the plurality of initial loudness values to a loudness threshold and selectively discard at least some of the initial loudness values that do not satisfy the loudness threshold,
  compute an adjusted loudness threshold based at least partly on a deviation between a representation of the initial loudness values that have not been discarded and a representation of a previous adaptive loudness threshold computed for previous frame, the adjusted adaptive loudness threshold computed for the current frame being different from the previous adaptive loudness threshold computed for the previous frame, wherein the adaptive loudness threshold is responsive to transient loudness spikes in the audio signal so that the subsequent loudness adjustment substantially compensates for the transient loudness spikes, and
  in response to comparing initial loudness values that have not been discarded to the adjusted adaptive loudness threshold, selectively discard at least some of the initial loudness values that do not satisfy the adjusted adaptive loudness threshold, wherein selectively discarding the at least some of the initial loudness values includes discarding at least one block of samples corresponding to the at least some of the initial loudness values, and wherein the at least one discarded block of samples is excluded from further processing;
 a dynamics control module configured to adjust loudness of the audio signal based at least partly on the initial loudness values that have not been discarded, wherein said adjusting comprises applying larger adjustment to second portions of the audio signal due to the transient loudness spikes than to third portions of the audio signal having lower amplitude loudness changes than the transient loudness spikes; and
 an output module configured to provide the adjusted audio signal for playback.

11. The system of claim 10, wherein the loudness analysis module is configured to selectively discard those of the initial loudness values that are below the adjusted adaptive loudness threshold.

12. The system of claim 10, wherein the loudness analysis module is further configured to compute the adjusted adaptive loudness threshold based at least in part on a loudness value of the previous frame.

13. The system of claim 12, wherein the loudness analysis module is configured to compute the adjusted adaptive loudness threshold based at least in part on a difference between the previous loudness value and at least one of a mean loudness value of the current frame and the initial loudness value.

14. The system of claim 13, wherein the loudness analysis module is configured to accumulate the difference.

15. The system of claim 14, wherein the difference is bounded by a lower bound and an upper bound.

16. The system of claim 10, wherein the loudness analysis module is further configured to compute the adjusted adaptive loudness threshold based at least in part on a difference between the initial loudness value and the mean loudness value of the current frame.

17. The system of claim 10, wherein:
 the loudness analysis module is further configured to compute a weighted average of at least some of the initial loudness values to produce an adjusted loudness value; and
 the dynamics control module is further configured to adjust the loudness of the audio signal based at least partly on the adjusted loudness value.

18. The system of claim 17, wherein the loudness analysis module is configured to compute weights in the weighted average based at least partly on one or both of recency of the initial loudness values and variation of the initial loudness values.

19. The system of claim 18, further comprising a perceptual information content estimation module configured to perform a modulation spectrum domain analysis of the audio signal, wherein the modulation spectrum domain analysis comprises computing a coefficient of variation among time-frequency representations of the audio signal, and the loudness analysis module is further configured to compute the weights based at least partly on the modulation spectrum domain analysis of the audio signal.

* * * * *